United States Patent
Ito et al.

(10) Patent No.: US 8,519,080 B2
(45) Date of Patent: Aug. 27, 2013

(54) CROSSLINKABLE PREPOLYMER, ITS PRODUCTION PROCESS AND ITS USES

(75) Inventors: Masahiro Ito, Chiyoda-ku (JP);
Shunsuke Yokotsuka, Chiyoda-ku (JP);
Takeshi Eriguchi, Chiyoda-ku (JP);
Kaori Tsuruoka, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 826 days.

(21) Appl. No.: 12/277,598

(22) Filed: Nov. 25, 2008

(65) Prior Publication Data
US 2009/0081376 A1    Mar. 26, 2009

Related U.S. Application Data

(63) Continuation of application No. PCT/JP2007/061126, filed on May 31, 2007.

(30) Foreign Application Priority Data

Jun. 2, 2006   (JP) .................................... 06-154515
Nov. 22, 2006  (JP) .................................... 06-315359

(51) Int. Cl.
*C08G 61/02*    (2006.01)
*C08G 65/38*    (2006.01)
*C08J 7/18*     (2006.01)

(52) U.S. Cl.
USPC .............................. 528/86; 528/219; 427/487

(58) Field of Classification Search
USPC ........................ 427/487; 528/86, 205, 219
See application file for complete search history.

(56) References Cited

U.S. PATENT DOCUMENTS

| 5,155,175 A | 10/1992 | Mercer et al. |
| 6,881,811 B2 | 4/2005 | Yokotsuka et al. |
| 2006/0155097 A1* | 7/2006 | Weber et al. .................. 528/125 |
| 2006/0173129 A1 | 8/2006 | Yokotsuka et al. |
| 2008/0132669 A1 | 6/2008 | Eriguchi et al. |

FOREIGN PATENT DOCUMENTS

| JP | 5502257 | 4/1993 |
| JP | 10074750 | 3/1998 |
| JP | 10247646 | 9/1998 |
| JP | 2002-356551 | 12/2002 |
| JP | 2002356551 | 12/2002 |
| JP | 2003217343 | 7/2003 |
| JP | 2003231750 | 8/2003 |
| JP | 2005-60515 | 3/2005 |
| JP | 2005105115 | 4/2005 |
| WO | WO 03/008483 A1 | 1/2003 |
| WO | WO 03/099915 A1 | 12/2003 |
| WO | WO 2006/137327 | 12/2006 |
| WO | WO 2007/119384 A1 | 10/2007 |

OTHER PUBLICATIONS

U.S. Appl. No. 12/968,330, filed Dec. 15, 2010, Ito, et al.
U.S. Appl. No. 12/976,583, filed Dec. 22, 2010, Eriguichi, et al.
U.S. Appl. No. 13/234,768, filed Sep. 16, 2011, Takenobu, et al.
U.S. Appl. No. 13/724,571, filed Dec. 21, 2012, Ito, et al.

* cited by examiner

*Primary Examiner* — Ling-siu Choi
*Assistant Examiner* — Aiqun Li
(74) *Attorney, Agent, or Firm* — Oblon, Spivak, McClelland, Maier & Neustadt, L.L.P.

(57) ABSTRACT

To provide a prepolymer which is excellent in heat resistance and which can form a cured product excellent in oil repellency and water repellency.

A crosslinkable prepolymer having a polyaryl ether structure on its main chain, which has a crosslinkable functional group and a side chain represented by "Rf-CH$_2$—O—" wherein Rf is a C$_{3\text{-}50}$ fluorinated alkyl group (which may contain an oxygen atom forming an ether bond).

19 Claims, No Drawings

CROSSLINKABLE PREPOLYMER, ITS PRODUCTION PROCESS AND ITS USES

TECHNICAL FIELD

The present invention relates to a crosslinkable prepolymer, a process for producing the crosslinkable prepolymer, a negative photosensitive composition containing the crosslinkable prepolymer and uses of the crosslinkable prepolymer.

BACKGROUND ART

With respect to a polymer having a polyaryl ether structure on its main chain, for example, the following Patent Document 1 proposes a process for producing a crosslinkable prepolymer having a polyaryl ether structure on its main chain and having a crosslinkable functional group introduced therein, by condensating a compound having a phenolic hydroxyl group or a fluorine-substituted aromatic ring and a crosslinkable functional group, a fluorine-substituted aromatic compound, and a compound having at least 3 phenolic hydroxyl groups.

A material having water repellency or oil repellency is widely used for an application to e.g. a nanoimprint, a bank material, a gas barrier film or a photoresist (e.g. the following Patent Document 2). Usually, its patterning method (a method for forming patterns (concavoconvex forms)) may, for example, be dry-etching, wet-etching, screen-printing, inkjet-printing or photolithography using photosensitivity of the material itself.

With one having photosensitivity in the material itself, it will be unnecessary to use a photoresist which is required for patterning a nonphotosensitive material, and it is possible to expect an improvement of productivity such as reduction of the number of production steps or improvement of the yield. Further, it is attracting attention as it provides a process step with low environmental burdens such that the amount of a solvent to be used, may be reduced.

Patent Document 1: JP-A-2005-105115
Patent Document 2: JP-A-2005-60515

DISCLOSURE OF THE INVENTION

Objects to be Accomplished by the Invention

The cured product made of a crosslinkable prepolymer in Patent Document 1, is excellent in heat resistance, but depending on an application, its oil repellency and water repellency were not necessarily sufficient.

The present invention has been made under the above circumstances, and it provides a prepolymer capable of forming a cured product excellent in heat resistance as well as in oil repellency and water repellency, its production process and its uses.

Further, the present invention provides a new negative photosensitive composition capable of easily forming an article which is excellent in such a heat resistance and also in oil repellency and water repellency and which has concavoconvex forms on the surface without using a photoresist, a process for producing a cured film by using the negative photosensitive composition, and uses of the negative photosensitive composition.

Means to Accomplish the Objects

The present invention provides the following.

1. A crosslinkable prepolymer having a polyaryl ether structure on its main chain, which has a crosslinkable functional group and a side chain represented by the following formula (I):

$R^f$—$CH_2$—O— (I)

(wherein $R^f$ is a $C_{3-50}$ fluorinated alkyl group (which may contain an oxygen atom forming an ether bond)).

2. The crosslinkable prepolymer according to the above 1, wherein the above main chain has a halogen-substituted aromatic ring having some or all of hydrogen atoms bonded to an aromatic ring substituted by halogen atoms, and the side chain represented by the above formula (I) is bonded to the halogen-substituted aromatic ring.

3. The crosslinkable prepolymer according to the above 2, which is obtained by introducing the side chain represented by the above formula (I) to a precursor (P21) obtained by subjecting either one or both of a compound (Y-1) having a crosslinkable functional group and a phenolic hydroxyl group, and a compound (Y-2) having a crosslinkable functional group and "an aromatic ring substituted by fluorine atoms reactive with a phenolic hydroxyl group"; a fluorinated aromatic compound (B) represented by the following formula (1):

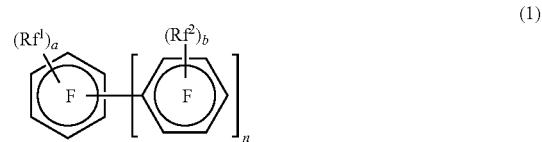

(1)

(wherein n is an integer of from 0 to 2, each of a and b which are independent of each other, is an integer of from 0 to 3, each of $Rf^1$ and $Rf^2$ which are independent of each other, is a fluorinated alkyl group having at most 8 carbon atoms, provided that when multiple $Rf^1$ and $Rf^2$ are present, they may be the same or different, and F in the aromatic ring represents that hydrogen atoms bonded to the aromatic ring are all substituted by fluorine atoms), and a compound (C) having at least 3 phenolic hydroxyl groups, to a condensation reaction in the presence of a hydrogen fluoride scavenger.

4. The crosslinkable prepolymer according to the above 2, which is obtained by introducing the side chain represented by the above formula (I) and further introducing a crosslinkable functional group, to a precursor (P11) obtained by subjecting the fluorinated aromatic compound (B) represented by the above formula (1) and a compound (C) having at least 3 phenolic hydroxyl groups, to a condensation reaction in the presence of a hydrogen fluoride scavenger.

5. The crosslinkable prepolymer according to the above 4, wherein the method of introducing the crosslinkable functional group is a condensation reaction with either one or both of a compound (Y-1) having a crosslinkable functional group and a phenolic hydroxyl group, and a compound (Y-2) having a crosslinkable functional group and "an aromatic ring substituted by fluorine atoms reactive with a phenolic hydroxyl group", which is carried out in the presence of a hydrogen fluoride scavenger.

6. A process for producing a crosslinkable prepolymer, which comprises reacting, in the presence of a hydrogen fluoride scavenger, a precursor (P2) which is a polymer having a polyaryl ether structure on its main chain and which has a crosslinkable functional group and has "an aromatic ring substituted by halogen atoms reactive with a phenolic hydroxyl group" on its main chain, with an alcohol (Q) represented by the following formula (II):

$$R^f\text{—}CH_2\text{—}OH \tag{II}$$

(wherein $R^f$ is a $C_{3-50}$ fluorinated alkyl group (which may contain an oxygen atom forming an ether bond)).

7. The process for producing a crosslinkable prepolymer according to the above 6, wherein as the precursor (P2), a precursor (P21) is used, which is obtained by subjecting either one or both of a compound (Y-1) having a crosslinkable functional group and a phenolic hydroxyl group, and a compound (Y-2) having a crosslinkable functional group and "an aromatic ring substituted by fluorine atoms reactive with a phenolic hydroxyl group"; the fluorinated aromatic compound (B) represented by the above formula (1), and a compound (C) having at least 3 phenolic hydroxyl groups, to a condensation reaction in is the presence of a hydrogen fluoride scavenger.

8. A process for producing a crosslinkable prepolymer, which comprises reacting, in the presence of a hydrogen fluoride scavenger, a precursor (P1) which is a polymer having a polyaryl ether structure on its main chain and which has "an aromatic ring substituted by halogen atoms reactive with a phenolic hydroxyl group" on its main chain, with the alcohol (Q) represented by the above formula (II) and further introducing a crosslinkable functional group.

9. The process of producing a crosslinkable prepolymer according to the above 8, wherein as the precursor (P1), a precursor (P11) is used, which is obtained by subjecting the fluorinated aromatic compound (B) represented by the above formula (1) and a compound (C) having at least 3 phenolic hydroxyl groups, to a condensation reaction in the presence of a hydrogen fluoride scavenger.

10. The process for producing a crosslinkable prepolymer according to the above 8 or 9, wherein the method of introducing the crosslinkable functional group is a condensation reaction with either one or both of a compound (Y-1) having a crosslinkable functional group and a phenolic hydroxyl group, and a compound (Y-2) having a crosslinkable functional group and "an aromatic ring substituted by fluorine atoms reactive with a phenolic hydroxyl group", which is carried out in the presence of a hydrogen fluoride scavenger.

11. A process for producing a crosslinkable prepolymer, which comprises a step (S1) of subjecting the fluorinated aromatic compound (B) represented by the above formula (1) and a compound (C) having at least 3 phenolic hydroxyl groups, to a condensation reaction in the presence of a hydrogen fluoride scavenger, a step (S2) of introducing a crosslinkable functional group by reacting either one or both of a compound (Y-1) having a crosslinkable functional group and a phenolic hydroxyl group, and a compound (Y-2) having a crosslinkable functional group and "an aromatic ring substituted by fluorine atoms reactive with a phenolic hydroxyl group", for a condensation reaction in the presence of a hydrogen fluoride scavenger, and a step (S3) of introducing a side chain by reacting the alcohol (Q) represented by the above formula (II) in the presence of a hydrogen fluoride scavenger.

12. A cured product formed by curing the crosslinkable prepolymer as defined in any one of the above 1 to 5.

13. A coating composition comprising the crosslinkable prepolymer as defined in any one of the above 1 to 5, and a solvent.

14. A cured film formed by forming a wet film by applying the coating composition as defined in the above 13 on a substrate, removing the solvent in the wet film, and then, or at the same time as removing the solvent, curing the crosslinkable prepolymer.

15. An article having the cured film as defined in the above 14.

16. A negative photosensitive composition which comprises the crosslinkable prepolymer as defined in any one of the above 1 to 5, a photosensitizer and a solvent.

17. The negative photosensitive composition according to the above 16, wherein the above photosensitizer contains either a photoinitiator or a photocrosslinking agent.

18. A process for producing a cured film, which comprises a step of forming a coating film made of the negative photosensitive composition as defined in the above 16 or 17, on a substrate, a step of exposure wherein a portion of the coating film is selectively exposed, and at the portion exposed, the reaction of the above crosslinkable functional group is carried out, and a step of development after the step of exposure.

19. A cured film which is obtained by the process as defined in the above 18.

20. An article having the cured film as defined in the above 19.

Effects of the Invention

According to the present invention, it is possible to obtain a crosslinkable prepolymer capable of forming a cured product excellent in heat resistance and also in oil repellency and water repellency.

The cured product of the present invention can accomplish excellent heat resistance, oil repellency and water repellency simultaneously.

According to the coating composition of the present invention, it is possible to form a cured film excellent in heat resistance and also in oil repellency and water repellency.

The cured film of the present invention can accomplish excellent heat resistance, oil repellency and water repellency simultaneously.

The article of the present invention has a film excellent in heat resistance and also in oil repellency and water repellency.

Further, the negative photosensitive composition of the present invention, has photosensitivity by itself, whereby it is possible to form a cured film having negative concavoconvex forms formed thereon by a photolithography method. Further, it contains the above specified crosslinkable prepolymer, whereby it is possible to obtain a cured film having water repellency and oil repellency.

In the present invention, according to the process for producing a cured film by using the negative photosensitive composition, it is possible to obtain a cured film having concavoconvex forms wherein an exposed portion in the step of exposure corresponds to a convex portion, and a non-exposed portion corresponds to a concave portion. The cured film obtained in such a manner, has concavoconvex forms as well as water repellency and oil repellency. Further, according to the present invention, it is possible to easily form an article provided with the cured film having concavoconvex forms formed and having water repellency and oil repellency, without using a photoresist and without separately carrying out a step of imparting water repellency and oil repellency, and it is possible to obtain high productivity.

Further, the obtained cured film satisfies a low dielectric constant, a low water absorption rate and high heat resistance simultaneously. Therefore, when it is used for e.g. memory devices of various memories or logic devices of microprocessors, it is possible to improve electrical characteristics of the devices. Further, it is rarely affected by water or heat, whereby it is possible to improve the reliability at the same time as the electrical characteristics.

The obtained cured film is excellent in the alkali resistance. That is, even if it is exposed to an alkali atmosphere, the excellent water repellency and oil repellency will be maintained.

Further, the crosslinkable prepolymer of the present invention can form a cured film excellent in flexibility, whereby, a film strong against an external force such as bending, will be obtained. Further, a thick film can easily be obtained.

BEST MODE FOR CARRYING OUT THE INVENTION

Crosslinkable Prepolymer

The crosslinkable prepolymer (hereinafter sometimes referred to simply as the prepolymer) of the present invention is a polymer having a polyaryl ether structure on its main chain, and it has a crosslinkable functional group and a side chain represented by the above formula (I).

Main Chain

In the present invention, "the polyaryl ether structure" means a polymer structure constituted by repetition of a structure wherein two aromatic rings are bonded through an ether bond (—O—). Further, "the aromatic ring" in the present invention means a ring structure in a cyclic organic compound having aromaticity, and it includes one having an optional substituent unless otherwise specified.

The term "having a polyaryl ether structure on its main chain" means that in each aromatic ring constituting the polyaryl ether structure, at least 2 carbon atoms constituting the ring are carbon atoms in a carbon chain constituting the main chain (wherein an ether bond between two aromatic rings is regarded as a part of the carbon chain constituting the main chain, i.e. an ether bond may be interposed between two aromatic rings; the same applies hereinafter).

In the crosslinkable prepolymer of the present invention, the carbon chain constituting the main chain may be branched. In the present invention, even if the carbon chain is branched (branched chain), a portion containing a polyaryl ether structure or a portion containing "an aromatic ring wherein at least 2 carbon atoms are carbon atoms in the carbon chain" is regarded as a part of the main chain, and the terminal portion which does not contain such a structure is referred to as "a side chain".

In the polyaryl ether structure of the main chain, one of two aromatic rings bonded via an ether bond is preferably a halogen-substituted aromatic ring wherein some or all hydrogen atoms bonded to the aromatic ring are substituted by halogen atoms.

The halogen atoms in the above halogen-substituted aromatic ring are preferably fluorine atoms. The above halogen-substituted aromatic ring is preferably one wherein all hydrogen atoms bonded to the aromatic ring are substituted by halogen atoms, and it is more preferably a perfluoroaromatic ring wherein all of such hydrogen atoms are substituted by fluorine atoms.

The main chain may have other aromatic rings other than the aromatic rings constituting the polyaryl ether structure. Such other aromatic rings are preferably the above halogen-substituted aromatic ring, more preferably the above perfluoroaromatic ring.

Crosslinkable Functional Group

The crosslinkable functional group in the present invention is a reactive functional group which undergoes substantially no reaction at the time of producing the prepolymer, and which undergoes a reaction to cause crosslinking or chain extension between prepolymer molecules, by addition of an external energy, at the time of producing a cured product such as a membrane, film or molded product, or at an optional time after the production.

The external energy may, for example, be heat, light or electron beams. They may be used in combination. When heat is used as the external energy, the reactive functional group is preferably one which reacts at a temperature of from 40° C. to 500° C. If the reaction temperature is too low, it is not possible to secure the stability during the storage of the prepolymer or a coating composition containing the prepolymer, and if it is too high, the heat decomposition of the prepolymer itself takes place. Therefore, the temperature is preferably in the above range. The temperature is more preferably from 60° C. to 400° C., most preferably from 70° C. to 350° C.

When light (actinic rays) is used as the external energy, it is preferred to incorporate a photosensitizer in the prepolymer or in the coating composition containing the prepolymer. In such a case, in the step of exposure, by selectively irradiating the prepolymer with actinic rays, it is possible to make the prepolymer at the exposed portion have a high molecular weight. Even after the steps of exposure and development, if necessary, it is possible to make the prepolymer have higher molecular weight by applying the external energy such as actinic rays or heat.

Specific examples of the crosslinkable functional group may be a vinyl group, an allyl group, a methacryloyl(oxy) group, an acryloyl(oxy) group, a vinyl oxy group, a trifluorovinyl group, a trifluorovinyl oxy group, an ethynyl group, a 1-oxocyclopenta-2,5-dien-3-yl group, a cyano group, an alkoxysilyl group, a diarylhydroxymethyl group and a hydroxyfluorenyl group. A vinyl group, a methacryloyl(oxy) group, an acryloyl(oxy) group, a trifluorovinyl oxy group or an ethynyl group is preferred from such a viewpoint that the reactivity is high, and a high crosslink density can be obtained. And a vinyl group or an ethynyl group is most preferred from such a viewpoint that a cured product to be obtained will have suitable heat resistance. Further, a methacryloyl(oxy) group means a methacryloyl group or a methacryloyloxy group, and the same applies to an acryloyl(oxy) group.

Each of the above examples of the crosslinkable functional group is a functional group which undergoes a reaction when irradiated with actinic rays in the presence of a photosensitizer, and when heated at a temperature of from 40 to 500° C.

The crosslinkable functional group may be in the main chain or in the side chain. Further, "the crosslinkable functional group is in the main chain" means that at least one carbon atom (which may contain an oxygen atom forming an ether bond) constituting the crosslinkable functional group is a carbon atom in the carbon chain constituting the main chain.

From the viewpoint of availability of raw materials, it is preferred that the crosslinkable functional group is in the side chain, and the main chain does not contain the crosslinkable functional group.

The content of the crosslinkable functional group in the prepolymer of the present invention is preferably from 0.1 to 4 mmol, more preferably from 0.2 to 3 mmol, per gram of the prepolymer. When the content is adjusted to be at least 0.1 mmol, the heat resistance and the solvent resistance of a cured product can be increased, and when it is adjusted to be at most 4 mmol, brittleness can easily be suppressed to be low.

Side Chain Represented by Formula (I)

In the above formula (I), $R^f$ is a $C_{3-50}$ fluorinated alkyl group which may contain an oxygen atom forming an ether bond. The fluorinated alkyl group as $R^f$ means one having some or all hydrogen atoms bonded to carbon atoms of an alkyl group, substituted by fluorine atoms. Further, such a fluorinated alkyl group may be a linear alkyl group or a cycloalkyl group.

$R^f$ is preferably a linear form, branched form or cyclic form. Further, $R^f$ is preferably a perfluoroalkyl group having all hydrogen atoms bonded to carbon atoms of an alkyl group, substituted by fluorine atoms.

With respect to a linear one among the side chains represented by the above formula (I), it is preferably one represented by the following formula (I-1) or the following formula (I-2).

With respect to the following formula (I-1), m is an integer of from 1 to 5, and $R^{fa}$ is a $C_{4-50}$ fluorinated alkyl group which may contain an oxygen atom forming an ether bond. m is more preferably an integer of from 1 to 3.

The example of the side chain represented by the following formula (I-1) may further preferably be a monovalent group represented by the following formula (I-1-1) or a monovalent group represented by the following formula (I-1-2).

(wherein k is an integer of from 1 to 10)

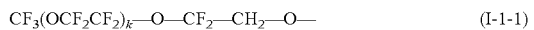

(wherein p is an integer of from 1 to 10)

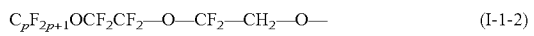

(wherein j is an integer of from 2 to 40)

Further, with respect to a branched one among the side chains represented by the above formula (I), it is preferably a monovalent group represented by the following formula (I-3) or (I-4).

(wherein i is an integer of from 0 to 10)

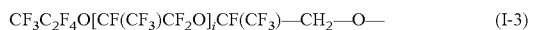

(wherein h is an integer of from 0 to 10)

Further, with respect to a cyclic one among the side chains represented by the above formula (I), it is preferably a monovalent group represented by the following formula (I-5), (I-6) or (I-7).

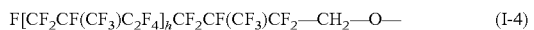

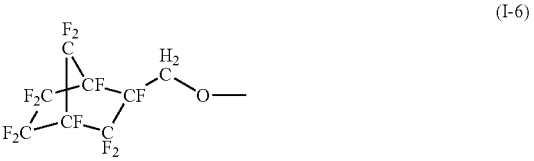

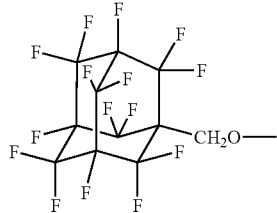

A position where the side chain represented by the formula (I) is to be introduced, is not particularly limited, but the side chain is preferably bonded to a halogen-substituted aromatic ring in the main chain from the viewpoint of production. That is, it is preferred that a halogen-substituted aromatic ring is present in the main chain, and the side chain represented by the formula (I) is bonded to such an aromatic ring.

The halogen-substituted aromatic ring having the side chain bonded, may be an aromatic ring constituting a polyaryl ether structure or another aromatic ring. From the viewpoint of easiness of producing the prepolymer, the side chain represented by the formula (I) is preferably bonded to the latter one, namely, to a halogen-substituted aromatic ring not constituting the polyaryl ether structure. Further, the halogen-substituted aromatic ring having the side chain bonded, is more preferably a perfluoroaromatic ring.

"The side chain represented by the formula (I)" which is present in one molecule of the prepolymer, may be one type or at least two types.

The content of "the side chain represented by the formula (I)" in the prepolymer of the present invention, is preferably from 0.01 to 1 g, more preferably from 0.05 to 0.5 g, per gram of the prepolymer. When the content is at least the value of the lower limit of the above range, the effects of improving water repellency and oil repellency can suitably be obtained, and when it is at most the value of the upper limit, the heat resistance becomes suitable.

Process for Producing Prepolymer

The prepolymer of the present invention can be produced by a process comprising a step (S1) of subjecting a fluorinated aromatic compound (B) represented by the above formula (1) and a compound (C) having at least 3 phenolic hydroxyl groups to a condensation reaction in the presence of a hydrogen fluoride scavenger, a step (S2) of introducing a crosslinkable functional group by reacting either one or both of a compound (Y-1) having a crosslinkable functional group and a phenolic hydroxyl group, and a compound (Y-2) having a crosslinkable functional group and "an aromatic ring substituted by fluorine atoms capable of reacting with a phenolic hydroxyl group", for a condensation reaction in the presence of a hydrogen fluoride scavenger, and a step (S3) of introducing a side chain by reacting an alcohol (Q) represented by the above formula (II) in the presence of a hydrogen fluoride scavenger. In the following description, the compound (Y-1) and compound (Y-2) may sometimes be referred to generally as a compound (Y).

More specifically, preferred is a method of carrying out the step (S3) after the steps (S1) and (S2) are carried out, or a method of carrying out the step (S2) after the steps (S1) and (S3) are carried out. Here, "the steps (S1) and (S2) are carried out" means that the step (S2) may be carried out after the step (S1) is carried out, or the steps (S1) and (S2) may be simultaneously carried out. The same applies to the case of the steps (S1) and (S3).

Each of the steps (S1), (S2) and (S3) is a condensation reaction to be carried out in the presence of a hydrogen fluoride scavenger (hereinafter sometimes referred to as a HF scavenger. Such a condensation reaction can be all done in one-stage or dividedly carried out in multi-stages. Further, it is permitted to let a specific compound among the reaction raw materials be reacted preferentially in advance, and then let the rest of compounds be reacted continuously. In a case where the condensation reaction is carried out in multi-stages, an intermediate product obtained in the middle of the reaction may be separated from the reaction system and purified, and then used for the subsequent reaction (the condensation reaction). For the reaction, the raw material compounds may be added all at once, continuously or intermittently.

Process of Using Precursor (P1)

Further, the process for producing the prepolymer of the present invention preferably comprises reacting, in the presence of a hydrogen fluoride scavenger, a precursor (P1) which is a polymer having a polyaryl ether structure on its main chain and which has "an aromatic ring substituted by halogen atoms reactive with a phenolic hydroxyl group" on its main chain, with an alcohol (Q) represented by the above formula (II), and further introducing a crosslinkable functional group. Specifically, the step (S1) is carried out to obtain the precursor (P1), and such a precursor (P1) is subjected to a condensation reaction with the alcohol (Q), followed by a condensation reaction with the compound (Y) to thereby obtain the prepolymer of the present invention.

In such a process, the precursor (P1) is produced first, whereby it is easy to control the molecular weight of the prepolymer. Further, when the reactivity of the alcohol (Q) is low as compared with the compound (Y), such a process is preferred to have the desired amount of alcohol (Q) reacted. That is, the process is preferred from the viewpoint that it is easy to control introduction of the desired amount of the side chain represented by the formula (I). Further, depending on the selection of the raw materials, if a crosslinkable functional group is introduced, the storage stability of the prepolymer may sometimes be lowered due to progress of the crosslinking reaction. In such a case, it becomes possible to store an intermediate product at the stage before introducing the crosslinkable functional group, and an improvement in yield of the prepolymer may sometimes be expected.

More specifically, as the precursor (P1), it is preferred to use a precursor (P11) obtained by subjecting the fluorinated aromatic compound (B) represented by the above formula (1) and a compound (C) having at least 3 phenolic hydroxyl groups, to a condensation reaction in the presence of a hydrogen fluoride scavenger. That is, it is preferred that after the step (S1) is carried out, the step (S3) is carried out to introduce a side chain represented by the formula (I), followed by carrying out the step (S2) to introduce a crosslinkable functional group.

Process of Using Precursor (P2)

As another process for producing the prepolymer of the present invention, it is also preferred that a precursor (P2) which is a polymer having a polyaryl ether structure on its main chain and which has a crosslinkable functional group and has "an aromatic ring substituted by halogen atoms reactive with a phenolic hydroxyl group" on its main chain, is reacted with an alcohol (Q) represented by the above formula (II) in the presence of a hydrogen fluoride scavenger. Specifically, the step (S1) and the step (S2) are carried out to obtain the precursor (P2), and such a precursor (P2) is subjected to a condensation reaction with the alcohol (Q) to obtain the prepolymer of the present invention. This process is preferred in that the precursor (P2) is produced first, whereby it is easy to simplify the production step of the prepolymer.

More specifically, it is preferred to use, as the precursor (P2), a precursor (P21) which is obtained by subjecting either one or both of a compound (Y-1) having a crosslinkable functional group and a phenolic hydroxyl group, and a compound (Y-2) having a crosslinkable functional group and "an aromatic ring substituted by fluorine atoms reactive with a phenolic hydroxyl group", a fluorinated aromatic compound (B) represented by the above formula (1), and a compound (C) having at least 3 phenolic hydroxyl groups, to a condensation reaction in the presence of a hydrogen fluoride scavenger. That is, it is preferred that the steps (S1) and (S2) are carried out to introduce a crosslinkable functional group, and then the step (S3) is carried out to introduce a side chain. Further, the precursor (P2) can also be obtained by reacting the compound (Y) after the precursor (P1) is obtained.

Further, "an aromatic ring substituted by halogen atoms reactive with a phenolic hydroxyl group" is preferably an aromatic ring having at least 2 hydrogen atoms bonded to the aromatic ring substituted by halogen atoms, and all of the hydrogen atoms are preferably substituted by halogen atoms. Such halogen atoms are preferably fluorine atoms, and "an aromatic ring substituted by halogen atoms reactive with a phenolic hydroxyl group" is most preferably a perfluoroaromatic ring. The perfluoroaromatic ring may, for example, be perfluorophenyl or perfluorobiphenyl.

Further, "the aromatic ring substituted by halogen atoms reactive with a phenolic hydroxyl group" is introduced in the prepolymer by the fluorinated aromatic compound (B) or the compound (Y-2). Therefore, the side chain represented by the formula (I) is introduced in an aromatic ring derived from the fluorinated aromatic compound (B) or the compound (Y-2).

In the condensation reaction in the process for producing the prepolymer of the present invention, as shown in the following formula (2), an ether bond is formed by e.g. a reaction mechanism wherein a phenoxy group derived from a phenolic hydroxyl group attacks a carbon atom having a fluorine atom bonded of the fluorinated aromatic compound (B) and/or a carbon atom having a fluorine atom (or a halogen atom) bonded of (Y-2), followed by elimination of such a fluorine atom. Further, when the compound (C) and/or (Y-1) has 2 phenolic hydroxyl groups at ortho positions, by the same reaction mechanism, etc., there is a possibility that a dioxine structure is formed as shown in the following formula (3).

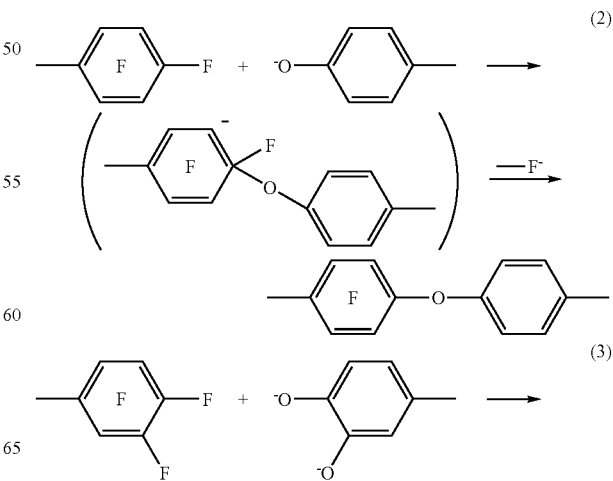

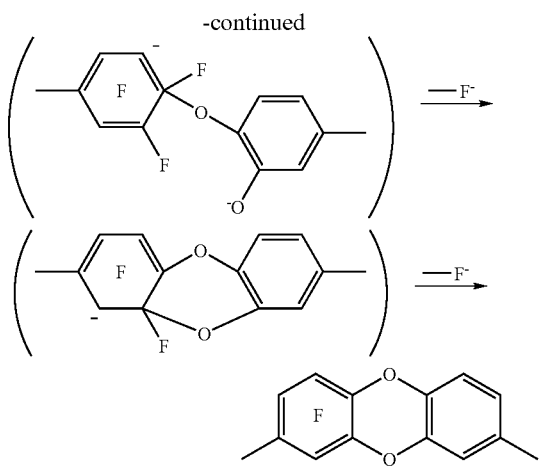

As a monomer to produce the prepolymer of the present invention, by using the compound (Y-1) or (Y-2) having a crosslinkable functional group, it is possible to obtain a prepolymer having the crosslinkable functional group introduced. Consequently, when the prepolymer of the present invention is to be cured, a crosslinking or chain extension reaction between prepolymer molecules will proceed to substantially improve the heat resistance. Further, by using the compound (Y-1) or (Y-2) having a crosslinkable functional group, it is also possible to obtain an effect to improve the solvent resistance of a cured product.

Further, by using the compound (C) having at least 3 phenolic hydroxyl groups, a branched structure will be introduced in the polymer chain, whereby it is possible to obtain a prepolymer having a three-dimensional molecular structure. Thus, it is possible to introduce the crosslinking group or the side chain represented by the above formula (I) in the prepolymer without decreasing the molecular weight of the prepolymer.

Further, by using the fluorinated aromatic compound (B) represented by the above formula (1), it is possible to improve the flexibility of the cured product. With respect to the prepolymer made by using the compound (B) as a monomer, the density of an ether bond will be high, and the flexibility of the main chain will be improved, as compared with a fluorinated aromatic polymer produced by using a fluorinated aromatic compound having a branched structure in itself as a monomer. Consequently, the cured product of the prepolymer of the present invention will be able to obtain good flexibility. Further, the flexibility of the cured product being good is particularly advantageous when the cured product is in a form of a cured film.

Fluorinated Aromatic Compound (B)

The fluorinated aromatic compound (B) is a fluorinated aromatic compound represented by the above formula (1). That is, the fluorinated aromatic compound (B) is a compound having "an aromatic ring substituted by fluorine atoms reactive with a phenolic hydroxyl group". Further, the fluorinated aromatic compound (B) is a compound having an aromatic ring capable of being bonded with the side chain represented by the above formula (I) in the condensation reaction with the alcohol (Q).

In the formula (1), each of $R^{f1}$ and $R^{f2}$ which are independent of each other, is a fluorinated alkyl group having at most 8, preferably at most 3, carbon atoms. When multiple $R^{f1}$s are present in one type of the fluorinated aromatic compound (B), they may be the same or different. Similarly, when multiple $R^{f2}$s are present, they may be the same or different.

The fluorinated alkyl group as $R^{f1}$ or $R^{f2}$, means one having some or all of hydrogen atoms bonded to carbon atoms of an alkyl group, substituted by fluorine atoms. From the viewpoint of heat resistance, a perfluoroalkyl group is preferred. Specifically, it may, for example, be a perfluoromethyl group, a perfluoroethyl group, a perfluoropropyl group, a perfluorobutyl group, a perfluorohexyl group or a perfluorooctyl group.

If the numbers of $R^{f1}$ and $R^{f2}$ become large, the production of the fluorinated aromatic compound (B) becomes difficult. Therefore, the number ("a" in the formula) of $R^{f1}$ is from 0 to 3, preferably from 0 to 2, most preferably 0. Further, the number (n number of "b" in the formula) of $R^{f2}$ is from 0 to 6, preferably from 0 to 2, most preferably 0.

In the above formula (1), n is an integer of from 0 to 2, and it is preferably 0 or 1, most preferably 1.

As specific examples of the fluorinated aromatic compound (B), the following compounds may suitably be exemplified.

When n=0, it may be perfluorobenzene, perfluorotoluene or perfluoroxylene; when n=1, it may be perfluorobiphenyl; when n=2, it may be perfluoroterphenyl; and when n=3, it may be perfluoro(1,3,5-triphenylbenzene) or perfluoro(1,2,4-triphenylbenzene). Particularly preferred is perfluorobenzene, perfluorobiphenyl, perfluoro(1,3,5-triphenylbenzene) or perfluoro(1,2,4-triphenylbenzene). They may be used alone or in combination as a mixture of two or more of them. When n=3, a branched structure will be introduced in the prepolymer, whereby it is possible to improve the heat resistance of a cured product.

As the fluorinated aromatic compound (B), perfluorobiphenyl is most preferred since the balance between the dielectric constant and heat resistance of a cured product to be obtained will be excellent, and the flexibility of the cured product will be high.

Compound (C)

The compound (C) is a compound having at least 3 phenolic hydroxyl groups. In the present invention, one having a crosslinkable functional group is not included in the compound (C).

Specific examples of the compound (C) may be trihydroxybenzene, trihydroxybiphenyl, trihydroxynaphthalene, 1,1,1-tris(4-hydroxyphenyl)ethane, tris(4-hydroxyphenyl)benzene, tetrahydroxybenzene, tetrahydroxybiphenyl, tetrahydroxybinaphthyl and tetrahydroxyspiroindane. The compound (C) is preferably a compound having 3 phenolic hydroxyl groups so that the flexibility of a cured film to be obtained will be high. Among them, 1,1,1-tris(4-hydroxyphenyl)ethane and trihydroxybenzene are more preferred.

The precursor (P11) is obtained by subjecting the compound (B) and the compound (C) to a condensation reaction in the presence of a HF scavenger. Then, introduction of the side chain represented by the above formula (I) and introduction of the crosslinkable functional group are carried out. For the introduction of the crosslinkable functional group, it is preferred to use the compound (Y-1) or the compound (Y-2).

The precursor (P21) is produced by either one or both of methods (i) and (ii).

(i) A method of subjecting the compound (B), compound (C) and compound (Y-1) to a condensation reaction in the presence of a HF scavenger.

(ii) A method of subjecting the compound (B), compound (C) and compound (Y-2) to a condensation reaction in the presence of a HF scavenger.

Further, when the precursor (P21) is produced by both of the above (i) and (ii), the fluorinated aromatic compound (B), compound (C), compound (Y-1) and compound (Y-2) are subjected to a condensation reaction in the presence of a HF scavenger.

Further, when the side chain represented by the above formula (I) is introduced in the precursor (P21), it is possible to obtain a prepolymer having "an aromatic ring having some or all hydrogen atoms bonded to the aromatic ring substituted by fluorine atoms" in its main chain, and the side chain represented by the above formula (I) bonded to the fluorinated aromatic ring.

Compound (Y-1)

The compound (Y-1) is one having a crosslinkable functional group and a phenolic hydroxyl group. The compound (Y-1) does not have "an aromatic ring substituted by fluorine atoms reactive with a phenolic hydroxyl group".

As the compound (Y-1), a compound (Y-1-1) having one phenolic hydroxyl group or a compound (Y-1-2) having two phenolic hydroxyl groups is preferred. (Y-1-1) functions as a monofunctional compound, and when it is used, a prepolymer having the crosslinkable functional group in the side chain can be obtained. (Y-1-2) functions as a difunctional compound, and when it is used, a precursor prepolymer having the crosslinkable functional group in the main chain can be obtained. Both of (Y-1-1) and (Y-1-2) can be used, and in such a case, a prepolymer having the crosslinkable functional groups in the main chain and the side chain, can be obtained.

Further, a phenolic hydroxyl group in the compound (Y-1) may be generated in the reaction system. Specifically, a protected phenolic hydroxyl group which becomes a phenolic hydroxyl group when hydrolyzed in the presence of an alkali, is considered to be the same phenolic hydroxyl group as above. More specifically, a compound such as an ester which provides a phenolic hydroxyl group in the presence of a hydrogen fluoride scavenger, is considered to be included in (Y-1).

As mentioned above, the prepolymer of the present invention preferably has a crosslinkable functional group only in the side chain, thus it is more preferred to use only (Y-1-1).

Further, the number of the crosslinkable functional groups in each of (Y-1-1) and (Y-1-2) is preferably 1.

Specific examples of the compound (Y-1-1) may be a phenol having a reactive double bond such as 4-hydroxystyrene, and an ethynylphenol such as 3-ethynylphenol, 4-phenylethynylphenol or 4-(4-fluorophenyl)ethynylphenol. Further, a specific example of the compound having a protected phenolic hydroxyl group may be 4-acetoxystyrene. They may be used alone or in combination as a mixture of two or more of them. An aromatic compound having a vinyl group or an ethynyl group as the crosslinkable functional group, is preferred, and more preferred is an aromatic compound having a vinyl group.

Further, 4-(4-fluorophenyl)ethynylphenol has an aromatic ring having one hydrogen atom bonded to the aromatic ring, substituted by a fluorine atom, but such a fluorine atom does not substantially reacts with a phenolic hydroxyl group. Thus, even a compound having a fluorine atom bonded to an aromatic ring, is included in the compound (Y-1-1) as long as the fluorine atom does not react with a phenolic hydroxyl group.

Specific examples of the compound (Y-1-2) may be a bis (phenylethynyl)dihydroxybiphenyl such as 2,2'-bis(phenylethynyl)-5,5'-dihydroxybiphenyl or 2,2'-bis(phenylethynyl)-4,4'-dihydroxybiphenyl, and a dihydroxydiphenylacetylene such as 4,4'-dihydroxytolan or 3,3'-dihydroxytolan. They may be used alone or in combination as a mixture of two or more of them.

Compound (Y-2)

The compound (Y-2) is one having a crosslinkable functional group and "an aromatic ring substituted by fluorine atoms reactive with a phenolic hydroxyl group". The compound (Y-2) does not have a phenolic hydroxyl group.

"An aromatic ring substituted by fluorine atoms reactive with a phenolic hydroxyl group" in the compound (Y-2), is an aromatic ring having preferably at least 2 hydrogen atoms bonded to the aromatic ring substituted by fluorine atoms, and it is preferably a perfluoroaromatic ring having all of such hydrogen atoms substituted by fluorine atoms. The perfluoroaromatic ring may, for example, be perfluorophenyl or perfluorobiphenyl.

When (Y-2) has one "fluorine atom reactive with a phenolic hydroxyl group", (Y-2) functions as a monofunctional compound, and when it has two such fluorine atoms, it functions as a difunctional compound. In a case where either one of them is used, it is possible to obtain a prepolymer having a crosslinkable functional group introduced in the side chain.

The number of the crosslinkable functional groups in (Y-2) is preferably 1.

Specific examples of the compound (Y-2) may be a fluorinated aryl having a reactive double bond such as pentafluorostyrene, pentafluorobenzyl acrylate, pentafluorobenzyl methacrylate, pentafluorophenyl acrylate, pentafluorophenyl methacrylate, perfluorostyrene, pentafluorophenyl trifluorovinyl ether or 3-(pentafluorophenyl)pentafluoro-1-propene; a fluorinated aryl having a cyano group such as pentafluorobenzonitrile; a fluorinated aryl acetylene such as pentafluorophenylacetylene or nonafluorobiphenylacetylene; and a fluorinated diarylacetylene such as phenylethynyl pentafluorobenzene, phenylethynyl nonafluorobiphenyl or decafluorotolan.

They may be used alone or in a mixture of two or more of them. The compound (Y-2) is preferably an aryl acetylene such as pentafluorophenylacetylene or a fluorinated aryl having a reactive double bond such as pentafluorostyrene, from the viewpoint that a crosslinking reaction will proceed at a relatively low temperature, and the heat resistance of a cured product of the prepolymer to be obtained, will be high.

Hydrogen Fluoride Scavenger

The hydrogen fluoride scavenger (the HF scavenger) to be used for producing the precursor (P1) or precursor (P2), is preferably a basic compound, particularly preferably a carbonate, hydrogen carbonate or hydroxide of an alkali metal. Specific examples may be sodium carbonate, potassium carbonate, sodium hydrogencarbonate, potassium hydrogencarbonate, sodium hydroxide and potassium hydroxide. The hydrogen fluoride scavenger to be used for producing the precursor (P1) or precursor (P2) is more preferably sodium carbonate, potassium hydroxide or potassium carbonate.

The amount of the HF scavenger to be used is required to be, by a molar ratio, at least 1 time, preferably from 1.1 to 3 times, of the molar amount of the phenolic hydroxyl group to be reacted. That is, it needs to be, by a molar ratio, at least 1 time, preferably from 1.1 to 3 times, of the amount of the hydroxyl groups of the compound (C) having a phenolic hydroxyl group, or of the total amount of the hydroxyl groups of the compound (C) and the compound (Y-1).

The above condensation reaction is preferably carried out in a polar solvent. The polar solvent is preferably a solvent containing a polar aprotic solvent such as N,N-dimethylacetamide, N,N-dimethylformamide, N-methylpyrrolidone, dimethylsulfoxide or sulfolane. To the polar solvent, toluene, xylene, benzene, tetrahydrofuran, benzotrifluoride or xylene hexafluoride may be incorporated within a range not to lower the solubility of a prepolymer to be formed or not to adversely affect the condensation reaction. By incorporating it, the polarity (dielectric constant) of the solvent will be changed, and it will be possible to control the reaction rate.

The conditions of the condensation reaction are preferably from 10 to 200° C. for from 1 to 80 hours, more preferably from 20 to 180° C. for from 2 to 60 hours, most preferably from 50 to 160° C. for from 3 to 48 hours.

The number average molecular weight of the prepolymer is in the range of from $1 \times 10^3$ to $5 \times 10^5$, preferably from $1.5 \times 10^3$ to $1 \times 10^5$. When it is in such a range, the coating characteristics of a coating composition containing the prepolymer of the present invention will be good, and a cured film to be obtained will have suitable heat resistance, mechanical characteristics, solvent resistance, etc.

In an application to an insulation film for electronic devices, a property to sufficiently penetrate into fine spaces of a substrate and to make the surface smooth (so-called gap-filling and planarization property) is required, and the number average molecular weight of the prepolymer is most preferably in a range of from $1.5 \times 10^3$ to $5 \times 10^4$.

In the process of using the compound (Y-1), the number average molecular weight of the prepolymer can be controlled by changing the charging ratio of the sum of the compound (C), compound (Y-1) and alcohol (Q) to the fluorinated aromatic compound (B). Here, it is preferred that a hydroxyl group does not remain in the prepolymer since water repellency and oil repellency will then be improved.

In the above condensation reaction, the fluorinated aromatic compound (B) usually functions as a difunctional compound. Therefore, the molecular weight is preferably controlled by adjusting the total molar amount of hydroxyl groups in the compound (C), compound (Y-1) and alcohol (Q) to be in a range where it does not exceed two times the molar amount of the fluorinated aromatic compound (B).

The number average molecular weight of the prepolymer in the process of using the compound (Y-2) can be controlled by changing the charging ratio of the sum of the fluorinated aromatic compound (B) and the compound (Y-2) to the sum of the compound (C) and the alcohol (Q). Here, in the same manner as above, the molecular weight is preferably controlled, when the compound (Y-2) functions as a monofunctional compound, by adjusting the total molar amount of hydroxide groups to be in a range where it does not exceed the sum of two times the molar amount of the fluorinated aromatic compound (B) and the molar amount of the compound (Y-2). Further, when the compound (Y-2) functions as a difunctional compound, it is preferred to adjust the total molar amount of hydroxide groups to be in a range where it does not exceed two times the total molar amount of the fluorinated aromatic compound (B) and the compound (Y-2).

Further, in the process of using the compound (Y-2), in a case where the reaction rates of the fluorinated aromatic compound (B) and the compound (Y-2) are different, the molecular weight or composition of the prepolymer thereby obtainable may sometimes be different depending upon the order of addition. For example, in a case where the reaction rates to phenoxy groups derived from the phenolic hydroxyl group of the compound (C) are (B)>(Y-2), if the fluorinated aromatic compound (B) and the compound (Y-2) are simultaneously charged, all phenoxy groups may be consumed by the fluorinated aromatic compound (B) before all the compound (Y-2) is consumed, whereby a non-reacted compound (Y-2) may remain. In such a case, in order to increase the reaction rate of the compound (Y-2), it is preferred that the compound (Y-2) is charged first, and then, the fluorinated aromatic compound (B) is charged. However, in such a method, variation in the composition of the molecular chain of a precursor to be obtained, tends to be large. When it is required to minimize such variation in the composition of the molecular chain of the precursor to be obtained, it is preferred to carry out the production by charging all at once.

In the process of using the compound (Y-1), the amount of the compound (C) to be used is preferably from 0.1 to 1 time, more preferably from 0.3 to 0.6 time, in a molar ratio to the fluorinated aromatic compound (B), and the amount of the compound (Y-1) to be used is preferably from 0.1 to 2 times, more preferably from 0.2 to 1.5 times, in a molar ratio to the fluorinated aromatic compound (B).

In the process of using the compound (Y-2), the amount of the compound (C) to be used is preferably from 0.5 to 2 times, more preferably from 0.6 to 1.5 times, in a molar ratio to the fluorinated aromatic compound (B), and the amount of the compound (Y-2) to be used is preferably from 0.1 to 2 times, more preferably from 0.2 to 1.5 times, in a molar ratio to the fluorinated aromatic compound (B). When the respective values are in such ranges, the obtained prepolymer of the present invention will have high heat resistance, such being desirable.

With respect to the prepolymer of the present invention, the compounds (Y-1) and (Y-2) are suitably selected depending on the physical properties such as heat resistance, flexibility, etc. of a cured product to be obtained by curing the prepolymer, whereby it is possible to produce a prepolymer which provides a cured product having desired physical properties.

With respect to the prepolymer of the present invention, it is preferred to optionally carry out purification by a method such as neutralization, reprecipitation, extraction or filtration, in an intermediate step after the condensation reaction (e.g. after the precursor is synthesized, or after the side chain represented by the above formula (I) is introduced).

Other Co-Condensation Components

With respect to the cured product produced by using the prepolymer, if the heat resistance of the cured product of the prepolymer is inadequate or the coating or film made of the cured product is brittle, a co-condensation component other than the above (B), (C), (Y-1), (Y-2) and (Q) may be incorporated at the time of the production of the prepolymer to improve the heat resistance or flexibility of the cured product.

Such a co-condensation component may, for example, be a compound (Z) having two phenolic hydroxyl groups other than (Y-1) in order to improve the flexibility of the cured film.

The compound (Z) having two phenolic hydroxyl groups may be a bifunctional phenol such as dihydroxybenzene, dihydroxybiphenyl, dihydroxyterphenyl, dihydroxyonaphthalene, dihydroxyanthracene, dihydroxyphenanthracene, dihydroxy-9,9-diphenylfluororene, dihydroxydibenzofuran, dihydroxydiphenyl ether, dihydroxydiphenyl thioether, dihydroxybenzophenone, dihydroxy-2,2-diphenylpropane, dihydroxy-2,2-diphenylhexafluoropropane or dihydroxybinaphthyl. They may be used alone or in combination as a mixture of two or more of them.

Alcohol (Q)

In the present invention, in order to introduce the side chain represented by the formula (I), it is preferred to use the alcohol (Q) represented by the formula (II). Particularly, it is preferred to react "the aromatic ring substituted by halogen atoms reactive with a phenolic hydroxyl group" with the alcohol (Q) in the presence of a hydrogen fluoride scavenger.

In the reaction of "the aromatic ring substituted by halogen atoms reactive with a phenolic hydroxyl group" with the alcohol (Q), like in the reaction represented by the above formula (2), an ether bond is formed by a reaction mechanism such that an alkoxy group derived from a hydroxyl group of the alcohol (Q) attacks a carbon atom having a halogen atom bonded of "the aromatic ring substituted by halogen atoms reactive with a phenolic hydroxyl group", and then such a halogen atom eliminates.

By such a reaction, the side chain having hydrogen removed from a hydroxyl group of the alcohol (Q), namely, the side chain represented by the above formula (I), will be introduced in the prepolymer.

$R^f$ in the above formula (II) is the same as $R^f$ in the above formula (I). More preferred specific examples of the alcohol (Q) represented by the above formula (II) may be the following ones.

When an alcohol represented by the above formula (II-1) is used, it is possible to obtain a prepolymer having the side chain represented by the above formula (I-1), and in a case where the following other alcohols are used, it is possible to obtain prepolymers having the corresponding side chains, respectively. The alcohols (Q) may be used alone or in combination as a mixture of two or more of them.

A linear one of the alcohol (Q) represented by the above formula (II) is preferably one represented by the following formula (II-1) or the following formula (II-2). In the following formula (II-1), m is an integer of from 1 to 5, $R^{fa}$ is a $C_{4-50}$ fluorinated alkyl group which may contain an oxygen atom forming an ether bond. m is more preferably an integer of from 1 to 3.

Further preferred example of the alcohol (Q) represented by the following formula (II-1) may be an alcohol represented by the following formula (II-1-1) or an alcohol represented by the following formula (II-1-2).

$$R^{fa}-O-(CF_2)_m-CH_2-OH \quad (II-1)$$

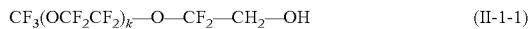
$$CF_3(OCF_2CF_2)_k-O-CF_2-CH_2-OH \quad (II-1-1)$$

(wherein k is an integer of from 1 to 10)

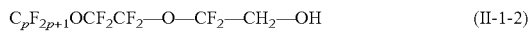
$$C_pF_{2p+1}OCF_2CF_2-O-CF_2-CH_2-OH \quad (II-1-2)$$

(wherein p is an integer of from 1 to 10)

$$CF_3(CF_2)_j-CH_2-OH \quad (II-2)$$

(wherein j is an integer of from 2 to 40)

Further, a branched one of the alcohol (Q) represented by the above formula (II) is preferably an alcohol represented by the following formula (II-3) or (II-4).

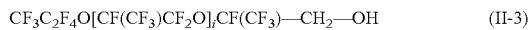
$$CF_3C_2F_4O[CF(CF_3)CF_2O]_iCF(CF_3)-CH_2-OH \quad (II-3)$$

(wherein i is an integer of from 0 to 10)

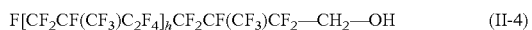
$$F[CF_2CF(CF_3)C_2F_4]_hCF_2CF(CF_3)CF_2-CH_2-OH \quad (II-4)$$

(wherein h is an integer of from 0 to 10)

Further, a cyclic one of the alcohol (Q) represented by the above formula (II) is preferably an alcohol represented by the following formula (II-5), (II-6) or (II-7).

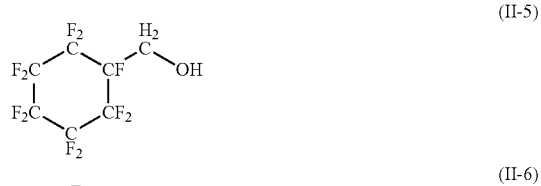

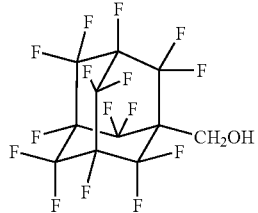

As the hydrogen fluoride scavenger to be used for the reaction of the alcohol (Q), it is possible to use the same HF scavenger used for the condensation reaction of the above compound (B), compound (C) and compound (Y). That is, as the HF scavenger, a basic compound is preferred, and an alkali metal hydride, carbonate, hydrogencarbonate or hydroxide is particularly preferred. Specific examples include sodium hydride, potassium hydride, sodium carbonate, potassium carbonate, cesium carbonate, sodium hydrogencarbonate, potassium hydrogencarbonate, sodium hydroxide, potassium hydroxide and cesium hydroxide. The hydrogen fluoride scavenger to be used for the reaction of the alcohol (Q) is more preferably sodium hydride, cesium carbonate, sodium hydroxide, potassium hydroxide or cesium hydroxide.

The amount of the HF scavenger to be used, is required to be at least equimolar, preferably from 1.1 to 3 times in a molar ratio, to the total molar amount of a hydroxyl group in the alcohol (Q) to be used.

When the alcohol (Q) is reacted, the reaction is preferably carried out in a polar solvent. The polar solvent is preferably an etheric solvent such as tetrahydrofuran or 1,4-dioxane, or a solvent containing polar aprotic solvent such as N,N-dimethylacetamide, N,N-dimethylformamide, N-methylpyrrolidone, dimethylsulfoxide or sulfolane.

The reaction conditions are preferably from 0 to 200° C. for 1 to 80 hours, more preferably from 20 to 180° C. for 2 to 60 hours, and most preferably from 30 to 100° C. for 3 to 48 hours.

Cured Product

When an external energy is applied to the prepolymer of the present invention, the crosslinkable functional group will react to let the crosslinking or chain extension between crosslinking prepolymer molecules proceed to give a cured product. The form of the cured product is not particularly limited. It may, for example, be a membrane, film or molded product.

Particularly, when a liquid coating composition containing the prepolymer of the present invention and the solvent is prepared, and the coating composition is applied on a substrate, followed by curing to form a film, the reaction of the crosslinkable functional group proceeds uniformly and a homogeneous cured product (cured film) is obtainable. Thus, the prepolymer of the present invention is suitable for the production of the cured film.

Coating Composition

The coating composition of the present invention contains the prepolymer of the present invention and a solvent. The coating composition containing the prepolymer of the present invention can be obtained by dissolving or dispersing the prepolymer into a solvent. The coating composition of the present invention is suitably used for the production of a cured membrane or a cured film. The coating composition of the present invention may contain other components if necessary.

Photosensitive Composition

The negative photosensitive composition of the present invention is one containing a photosensitizer among the above coating composition. That is, the negative photosensitive composition of the present invention comprises the above prepolymer, a photosensitizer and a solvent.

Photosensitizer

The photosensitizer to be used in the present invention is one having an effect to cause or let proceed a reaction of the crosslinkable functional group of the prepolymer under irradiation with actinic rays. The reaction of the crosslinkable functional group is a crosslinking reaction between prepolymer molecules or a chain extension reaction of prepolymer molecules, and by such a reaction, the prepolymer will have a high molecular weight.

The actinic rays may, for example, be X-rays, electron beams, ultraviolet rays or visible rays.

As the photosensitizer, it is preferred to use at least a photoinitiator (photo-radical generator) or a photocrosslinking agent. Both of them may be used in combination. Depending on the type of the crosslinking group, it is possible to use an acid generator or a base generator as the photosensitizer.

The photoinitiator generates radicals under light irradiation, and it is a material to cause a reaction of the crosslinkable functional group.

The photoinitiator may, for example, be a benzoine alkyl ether derivative, a benzophenone derivative, an α-aminoalkylphenone, an oxime ester derivative, a thioxanthone derivative, an anthraquinone derivative, an acylphosphine oxide derivative, a glyoxyester derivative, an organic peroxide, a trihalomethyltriazine derivative or a titanocene derivative.

Specifically, it may, for example, be IRGACURE 651, IRGACURE 184, DAROCURE 1173, IRGACURE 500, IRGACURE 2959, IRGACURE 754, IRGACURE 907, IRGACURE 369, IRGACURE 1300, IRGACURE 819, IRGACURE 819DW, IRGACURE 1880, IRGACURE 1870, DAROCURE TPO, DAROCURE 4265, IRGACURE 784, IRGACURE OXE01, IRGACURE OXE02 or IRGACURE 250 (manufactured by Ciba Specialty Chemicals K.K.), KAYACURE DETX-S, KAYACURE CTX, KAYACURE BMS or KAYACURE 2-EAQ (manufactured by Nippon Kayaku Co., Ltd.), TAZ-101, TAZ-102, TAZ-103, TAZ-104, TAZ-106, TAZ-107, TAZ-108, TAZ-110, TAZ-113, TAZ-114, TAZ-118, TAZ-122, TAZ-123, TAZ-140 or TAZ-204 (manufactured by Midori Kagaku Co., Ltd.).

Such photoinitiators may be used alone or in combination as a mixture of two or more of them.

Particularly, a highly-sensitive initiator is preferred from the viewpoint that curing can be done with low irradiation energy. The highly-sensitive initiator is preferably IRGACURE 907 (an α-aminoalkylphenone), IRGACURE 369 (an α-aminoalkylphenone), IRGACURE OXE01 (an oxime ester derivative) or IRGACURE OXE02 (an oxime ester derivative), particularly preferably IRGACURE OXE01 or IRGACURE OXE02.

The photoacid generator may, for example, be a diazodisulfone, a triphenyl sulfonium, an iodonium salt, a disulfone or a sulfone. Specifically, it may, for example, be TPS-105, DPI-102, DPI-105, DPI-106, DPI-109, DPI-201, BI-105, MPI-103, MPI-105, MPI-106, MPI-109, BBI-102, BBI-103, BBI-105, BBI-106, BBI-109, BBI-110, BBI-201, BBI-301, TPS-102, TPS-103, TPS-105, TPS-106, TPS-109, TPS-1000, MDS-103, MDS-105, MDS-109, MDS-205, BDS-109, DTS-102, DTS-103, DTS-105, NDS-103, NDS-105, NDS-155, NDS159, NDS-165, DS-100, DS-101, SI-101, SI-105, SI-106, SI-109, PI-105, PI-109, NDI-101, NDI-105, NDI-106, NDI-109, PAI-101, PAI-106, PAI-1001, NAI-100, NAI-1002, NAI-1003, NAI-1004, NAI-101, NAI-105, NAI-106, NAI-109, DAM-101, DAM-102, DAM-103, DAM-105, DAM-201, Benzoin tosylate, MBZ-101, MBZ-201, MBZ-301, PYR-100, DNB-101, NB-101, NB-201, TAZ-100, TAZ-101, TAZ-102, TAZ-103, TAZ-104, TAZ-106, TAZ-107, TAZ-108, TAZ-109, TAZ-110, TAZ-113, TAZ-114, TAZ-118, TAZ-122, TAZ-123, TAZ-140, TAZ-201, TAZ-203, TAZ-204, NI-101, NI-1002, NI-1003, NI-1004, NI-101, NI-105, NI-106, NI-109 (manufactured by Midori Kagaku Co., Ltd.), WPAG-145, WPAG-170, WPAG-199, WPAG-281, WPAG-336 or WPAG-367 (manufactured by Wako Pure Chemical Industries, Ltd.).

The photobasic generator may, for example, be a Co amine complex, an oxime carboxylate, a carbamate or a quaternary ammonium. Specifically, it may, for example, be TPS-OH, NBC-101 or ANC-101 (manufactured by Midori Kagaku Co., Ltd.).

The photocrosslinking agent may be a bisazido. The bisazido photocrosslinking agent undergoes decomposition of an azido group under irradiation with the actinic rays to form active nitrene, which induces addition to a double bond of the crosslinkable functional group or an insertion reaction to a C—H bond, whereby a crosslinking reaction is caused. The bisazido photocrosslinking agent is highly sensitive, such being desirable. Specific examples may, for example, be 2,6-bis[3-(4-azidophenyl)-2-propenylidene]cyclohexanone, 2,6-bis[3-(4-azidophenyl)-2-propenylidene]-4-methylcyclohexanone, 2,6-bis[3-(4-azidophenyl)-2-propenylidene]-4-ethylcyclohexanone, 2,6-bis[3-(4-azidophenyl)-2-propenylidene]-4-propylcyclohexanone, p-azidophenyl sulfone, m-azidophenyl sulfone, 4,4'-diazidostilbene, 4,4'-diazidobenzal acetophenone, 2,3'-diazido-1,4-naphthoquinone and 4,4'-diazidodiphenyl methane. Among them, 2,6-bis[3-(4-azidophenyl)-2-propenylidene]-4-methylcyclohexanone is particularly preferred.

At least a part of the photosensitizer needs to have sensitivity at the wavelength (exposure wavelength) of actinic rays irradiated in a step of exposure which will be described later. Consequently, under irradiation with the actinic rays in the step of exposure, the crosslinkable functional group undergoes a reaction, whereby the prepolymer is made to have a high molecular weight, and its solubility in a developer decreases.

For example, when the above photoinitiator does not have sensitivity to the exposure wavelength, or when the sensitivity is low, it is preferred to use a photoinitiator auxiliary agent having sensitivity to the exposure wavelength and/or a sensitizer in combination with the photoinitiator.

The photoinitiating auxiliary agent is one to accelerate the initiating reaction by its use in combination with the photoinitiator more than by the use of the photoinitiator alone. Specifically, it may, for example, be an amine, a sulfone or a phosphine. More specifically, it may, for example, be triethanolamine, methyldiethanolamine, triisopropanolamine, Michler ketone, 4,4'-diethylaminophenone or ethyl 4-dimethylamino benzoate.

The sensitizer is one which absorbs radiation spectrum not absorbed by the photoinitiator and becomes excited, so that the absorbed energy is transferred to the photoinitiator to let an initiating reaction start from the photoinitiator. The sensitizer may, for example, be a benzophenone derivative, an anthraquinone derivative or an acetophenone derivative.

The content of the photosensitizer in the photosensitive composition of the present invention is not particularly limited as long as it is at least an amount which can lower the solubility of the prepolymer in the developer. The content of the photosensitizer is desirably from 0.1 to 30 parts by mass, more preferably from 1 to 10 parts by mass, per 100 parts by mass of the prepolymer contained in the photosensitive composition.

When the content of the photosensitizer is at least the lower limit of the above range, the irradiation energy of the actinic rays needed in the step of exposure will not be too large, and when it is at most the upper limit of the above range, it is possible to prevent an adverse effect on an electrical characteristic or mechanical characteristic of the cured product.
Solvent The solvent in the coating composition, particularly the photosensitive composition of the present invention, may be one which can dissolve or disperse the prepolymer, the photosensitizer and an additive which may be optionally added. Further, it is preferred to use a suitable solvent to make the nature of the coating composition of the present invention so that it can form a film having a desired film thickness, good uniformity in thickness and gap filling and planarization property, as the case requires, by a desired method.

The solvent may, for example, be an aromatic hydrocarbon, a dipolar aprotic solvent, a ketone, an ester, an ether or a halogenated hydrocarbon. The solvent may be the same or different from the above reaction solvent used during the production of the prepolymer. When a different solvent is used, the prepolymer is once recovered from the reaction solution by e.g. a reprecipitation method and dissolved or dispersed in the different solvent, or solvent substitution may be carried out by using a known method such as an evaporation method or an ultrafiltration method.

The aromatic hydrocarbon may, for example, be benzene, toluene, xylene, ethylbenzene, cumene, mesitylene, tetraline or methylnaphthalene. The dipolar aprotic solvent may, for example, be N-methylpyrrolidone, N,N-dimethylformamide, N,N-dimethylacetamide, γ-butyrolactone or dimethyl sulfoxide.

The ketone may, for example, be cyclopentanone, cyclohexanone, cycloheptanone, cyclooctanone or methylamylketone. The ether may, for example, be tetrahydrofuran, pyran, dioxane, dimethoxyethane, diethoxyethane, diphenyl ether, anisole, phenetole, diglyme or triglyme.

The ester may, for example, be ethyl lactate, methyl benzoate, ethyl benzoate, butyl benzoate, benzyl benzoate, methyl cellosolve acetate, ethyl cellosolve acetate, propylene glycol monomethyl ether, propylene glycol monoethyl ether, propylene glycol monopropyl ether, propylene glycol monobutyl ether, propylene glycol monomethyl ether acetate, propylene glycol monoethyl ether acetate, dipropylene glycol monomethyl ether acetate or dipropylene glycol monoethyl ether acetate.

The halogenated hydrocarbon may, for example, be carbon tetrachloride, chloroform, methylene chloride, tetrachloroethylene, chlorobenzene or dichlorobenzene.

The amount of the solvent to be used is preferably adjusted to have a solid concentration of the prepolymer in the coating composition of the present invention being from 1 to 50 mass %, more preferably from 5 to 40 mass %.
Other Components To the photosensitive composition of the present invention, it is preferred to add various catalysts or additives for the purpose of increasing the reaction rate or decreasing reaction defects when the prepolymer is cured.

For example, when the prepolymer contains an ethynyl group as the crosslinkable functional group, the catalyst is preferably an amine such as aniline, triethylamine, aminophenyltrialkoxysilane or aminopropyltrialkoxysilane, or an organic metal compound such as molybdenum or nickel.

Further, the additive is preferably a biscyclopentadienone derivative. An ethynyl group and a cyclopentadienone group (1-oxocyclopenta-2,5-dien-3-yl group) form an adduct by a Diels-Alder reaction by heat, followed by a reaction for removing carbon monoxide to form an aromatic ring. Therefore, when the biscyclopentadienone derivative is used, a crosslink or chain extension having an aromatic ring as a bonding portion, will be formed.

Specific examples of the biscyclopentadienone derivative may, for example, be 1,4-bis(1-oxo-2,4,5-triphenyl-cyclopenta-2,5-dien-3-yl)benzene, 4,4'-bis(1-oxo-2,4,5-triphenyl-cyclopenta-2,5-dien-3-yl)biphenyl, 4,4'-bis(1-oxo-2,4,5-triphenyl-cyclopenta-2,5-dien-3-yl)1,1'-oxybisbenzene, 4,4'-bis(1-oxo-2,4,5-triphenyl-cyclopenta-2,5-dien-3-yl)1,1'-thiobisbenzene, 1,4-bis(1-oxo-2,5-di-[4-fluorophenyl]-4-phenyl-cyclopenta-2,5-dien-3-yl)benzene, 4,4'-bis(1-oxo-2,4,5-triphenyl-cyclopenta-2,5-dien-3-yl)1,1'-(1,2-ethane diyl)bisbenzene and 4,4'-bis(1-oxo-2,4,5-triphenyl-cyclopenta-2,5-dien-3-yl)1,1'-(1,3-propane diyl)bisbenzene.

Among such biscyclopentadienone derivatives, an entirely aromatic skeleton biscyclopentadienone derivative is preferred from the viewpoint of heat resistance. They may be used alone or in combination as a mixture of two or more of them.

To the coating composition of the present invention, it is possible to add, other than the above catalysts and/or additives, at least one additive selected from various additives well known in the coating field, such as a stabilizer such as an ultraviolet absorber, an antioxidizing agent or a heat polymerization inhibitor; a surfactant such as a leveling agent, an antifoaming agent, a precipitation inhibitor or a dispersant; a crosslinking agent; a plasticizer; or a thickener. When a membrane or film having pores is to be formed, it is possible to optionally blend a hollow body or a material which can be removed after the formation of a thin film, which will be described later.

The blending ratio of the prepolymer, photosensitizer and solvent, which mainly form the photosensitive composition, is such that the prepolymer is from 1 to 60 mass %, preferably from 2 to 50 mass %; the photosensitizer is from 0.1 to 20 mass %, preferably from 0.5 to 10 mass %; and the solvent is from 20 to 99 mass %, preferably from 30 to 98 mass %.
Cured Film With respect to a process for producing a cured product, as a preferred example of the cured product, a cured film is mentioned.

The coating composition of the present invention is applied on a surface of a proper substrate to form a wet film, and then, after or at the same time as the solvent is removed by e.g. evaporation, curing treatment is carried out to let the crosslinkable functional group in the prepolymer undergo a crosslinking reaction, whereby a cured film is formed.

As the method for forming the wet film, it is possible to use a coating method or a printing method. The coating method, may, for example, be a known coating method such as a spin coating method, a dip coating method, a spray coating method, a die-coating method, a bar coating method, a doctor coating method, an extrusion coating method, a scan coating method, a brush coating method or a potting method. The printing method may, for example, be a nanoimprinting method, a screen printing, a gravure printing or an ink-jet printing.

Further, when the prepolymer contains a low molecular weight substance having a substantial vapor pressure at normal temperature, in order to prevent volatilization at the time of baking, before the coating composition is applied, it is possible to have part of the crosslinkable functional group reacted in the solution. For such a method, heating is preferred. The condition of heating is preferably at a temperature of from 50° C. to 250° C. for 1 to 50 hours, more preferably at a temperature of from 70 to 200° C. for 1 to 20 hours. The reaction rate of the crosslinkable functional group in the solution is preferably less than 50%, more preferably less than 30% from the viewpoint of preventing the prepolymer from gelation in the solution.

The thickness of the wet film to be formed by the coating composition can be properly set depending on a desired form of a cured film to be produced. For example, for the purpose of producing a film, it is preferred to form the wet film of from 0.01 to 500 μm, more preferably from 0.1 to 300 μm on the substrate.

In the curing treatment, an external energy is added to let the crosslinkable functional group undergo a reaction. Such an external energy is selected depending on the type of the crosslinkable functional group present in the prepolymer.

Preferably, the crosslinkable functional group which undergoes the reaction by heat is used, and the curing treatment is carried out by baking (heating). The heating condition is preferably at a temperature of from 150 to 450° C. for from 1 to 120 minutes, more preferably at a temperature of from 160 to 350° C. for from 20 to 60 minutes. The heating equipment is preferably a hot plate, an oven or a furnace. The heating atmosphere may, for example, be an atmosphere of an inert gas such as nitrogen or argon, air, oxygen or reduced pressure. An inert gas atmosphere or a reduced gas atmosphere is preferred. In order to secure the surface smoothness of the thin film or to improve fine space gap-filling properties of the thin film, it is preferred to add a prebaking step at a temperature of from 50 to 250° C. or to carry out the heating step as divided into a plurality of stages.

The reaction rate of the crosslinkable functional group in the cured film, which will be obtained after the curing treatment, is preferably from 30 to 100 mol %. By adjusting the reaction rate to be at least 30 mol %, the heat resistance and chemical resistance of the cured film will be good. From such a viewpoint, the reaction rate is further preferably at least 50 mol %, most preferably at least 70 mol %.

The cured film to be obtained from the coating composition of the present invention can be removed from the substrate and used as a film element, and it may be used as e.g. a coating of e.g. a water repellent or oil repellent film in a state of being adhered on the substrate. In the latter case, for improvement of adhesion property between the cured film and the substrate, it is possible to use an adhesion promoter (an adhesion enhancer).

The adhesion promoter may, for example, be a silane coupling agent, a titanate coupling agent or an aluminum coupling agent. More preferred is a silane coupling agent of a vinylsilane, an acrylsilane, a styrylsilane, an epoxysilane or an aminosilane.

The vinylsilane may, for example, be vinyl trichlorosilane, vinyl trimethoxysilane or vinyl triethoxysilane. The styrylsilane may, for example, be p-styryl trimethoxysilane or p-styryl triethoxysilane.

The acrylsilane may, for example, be 3-acryloxy propyl trimethoxysilane, 3-methacryloxy propyl trimethoxysilane, 3-methacryloxy propyl triethoxysilane, 3-methacryloxy propyl methyl dimethoxysilane or 3-methacryloxy propyl methyl diethoxysilane.

The epoxy silane may, for example, be 2-(3,4-epoxycyclohexyl)ethyl trimethoxysilane, 3-glycidoxypropyl trimethoxysilane, 3-glycidoxypropyl methyldiethoxysilane or 3-glycidoxypropyl triethoxysilane.

The aminosilane may, for example, be an aliphatic aminosilane such as 3-aminopropyl methyl diethoxysilane or 3-aminopropyl triethoxysilane, or an aromatic group-containing aminosilane such as aminophenyl trimethoxysilane, aminophenyl triethoxysilane or N-phenyl-3-aminopropyl trimethoxysilane.

As a method for applying the adhesion promoter, it is preferred to employ a method of treating the substrate with the adhesion promoter prior to coating with the coating composition, or a method of adding the adhesion promoter to the coating composition. As the method of treating the substrate with the adhesion promoter, in the case of an aminosilane, a method of spin-coating the substrate with a 0.01 to 3 mass % solution in an alcohol may be mentioned. As such an alcohol, methanol, ethanol or isopropyl alcohol is preferred. In the method of adding the adhesion promoter in the prepolymer solution, the amount of the adhesion promoter to be added is preferably from 0.05 to 10 mass %, more preferably from 0.1 to 5 mass %. If the amount of the adhesion promoter to be added is small, the effect of improving the adhesion tends to be inadequate, and if it is too large, the heat resistance tends to decrease.

Process for Producing Cured Film by Photolithographic Method

By using the photosensitive composition of the present invention, it is possible to produce a cured film having negative concavoconvex forms formed by a photolithographic method.

That is, via a step of forming a coating film made of the photosensitive composition of the present invention on the substrate, a step of exposing the coating and a step of development after the exposure, it is possible to produce a cured film having concavoconvex forms formed thereon wherein an exposed portion corresponds to a convex portion.

Formation of Coating Film

First, the photosensitive composition is applied on the substrate to form a wet film. Such a wet film is dried by prebaking, whereby a coating film is formed. As a method for forming such a wet film, it is preferred to use the above-mentioned coating method. In a case where a cured film finally obtained is to be used as an insulation film for electronic devices, a spin coating method or a scanning coating method is preferred from the viewpoint of uniformity of the film thickness.

The thickness of the wet film can be properly set to meet the form of a cured film to be obtained. For example, it is preferred to form a wet film having a film thickness of from 0.01 to 500 μm, more preferably from 0.1 to 300 μm, on the substrate.

The heating condition at the time of prebaking the wet film is preferably a temperature at which the solvent becomes volatile, and the crosslinkable functional group of the prepolymer and an additive such as a photosensitizer, a photoinitiating auxiliary agent or a sensitizer do not substantially undergo a reaction. Specifically, it is preferably at a temperature of from 50 to 250° C. for 30 seconds to 10 minutes.

Step of Exposure

Then, exposure is carried out for the coating film formed on the substrate. In the step of exposure, by applying actinic rays (in the present specification, it may sometimes referred to as exposure rays) in desired pattern forms, crosslinking between prepolymer molecules by the reaction of the crosslinkable functional group and/or chain extension takes place at the exposed portion irradiated with the actinic rays. As a result, there will be a difference in solubility in the developer between the exposed portion and a non-exposed portion not irradiated with actinic rays.

The actinic rays may be ones to which the photosensitizer contained in the photosensitive composition has sensitivity. Specifically, X-rays, electron beams, ultraviolet rays or visible rays may be mentioned. Among them, ultraviolet rays or visible rays are preferred, and ones having a wavelength of from 200 to 500 nm are more preferred. The most preferred light source is ultra-high pressure mercury arc.

The dose of the rays to be irradiated can be suitably changed so that the solubility difference in the developer between the exposed portion and the non-exposed portion will be within a preferred range depending on the film thickness of the coating film and e.g. the type of the photosensitizer contained in the photosensitive composition. For example, when the film thickness of the coating film is 10 µm, the proper dose of the rays is from 100 to 2,000 mJ/cm$^2$.

Specifically, by carrying out exposure through a mask in a pressure mode, a vacuum-contact mode or a proximity mode by using an exposure apparatus such as an aligner or a stepper, it is possible to form patterns of an exposed portion and non-exposed portion on the coating film.

After the irradiation with the exposure rays, a step of baking after exposure may be carried out. When such a step of baking after exposure is carried out, it is possible to increase the reaction rate of a reactive intermediate having a long lifetime which is photochemically generated in the coating film under irradiation with the exposure rays. That is, in the step of baking after exposure, transfer of the reactive intermediate present in the coating film is accelerated, whereby the contacting probability of the reactive intermediate with a reaction site will increase, and the reaction rate will be improved. The heating temperature in baking after exposure differs depending on the type of the above reactive intermediate, but it is preferably from 50 to 250° C. The time for heating is preferably from 30 seconds to 10 minutes.

Further, also by heating during exposure, it is possible to accelerate transfer of the reactive intermediate. When heating is carried out during exposure, the sensitivity of e.g. the photosensitizer will also be increased by the heating. The heating temperature when baking is carried out during exposure differs depending on the type of the above reactive intermediate, but it is preferably from 50 to 250° C.

Development

Now, the coating film after the exposure is developed by a developer. The developing method may, for example, be a spray method, a puddle method, an immersion method or an ultrasonic wave method.

As the developer, a solvent is used, to which an exposed portion of the coating film is insoluble or only very slightly soluble, and a non-exposed portion of the coating film is soluble. Specific examples of the developer may be an aromatic hydrocarbon, a dipolar aprotic solvent, a ketone, an ester, an ether and a halogenated hydrocarbon, which are the same as the solvents mentioned as the solvents in the above photosensitive composition.

The conditions such as the concentration of the developer and the developing time, in the step of development, are properly set so that the desired concavoconvex forms can be obtained depending on the dissolving rate of the coating film at the exposed portion and non-exposed portion, in the developer.

After dissolving the non-exposed portion of the coating film to a desired level by development, rinsing may be carried out, if necessary. The rinsing agent is not particularly limited as long as it is one which is the same as the developer or which does not have as high solubility of the coating film as the developer and has compatibility with the developer. It may, for example, be an alcohol, the above ketone or the above ester.

Specific examples of the alcohol as the rinsing agent may be methanol, ethanol, 1-propanol, 2-propanol, 1-butanol, 2-butanol, 1-pentanol, 2-pentanol, 3-pentanol, tert-amyl alcohol and cyclohexanol.

The film after the development is subjected to rinsing as the case requires, followed by drying. Drying can be carried out by e.g. high speed spinning. Further, it is preferred to remove the solvent by carrying out a step of baking after the development. The step of baking after the development can be carried out on a hotplate or in an oven. The heating conditions are preferably at a temperature of from 80 to 200° C. for 0.5 to 60 minutes.

Curing

Thus, a film having concavoconvex forms formed on the surface will be obtained. If such a film is cured to a desired level, it can be used as a cured film as it is.

If the level of curing is insufficient, by further applying an external energy to let the unreacted crosslinkable functional group present in the film undergo a reaction, it is possible to let the curing further proceed. Accordingly, by letting the crosslinkable functional group undergo the reaction additionally, the prepolymer further undergoes crosslinking or chain extension, whereby the heat resistance and solvent resistance of the film will be improved.

As the above external energy, heat or actinic rays may be mentioned. When the actinic rays are used, irradiation is carried out in a state where a photosensitizer having sensitivity to such actinic rays is present in the photosensitive composition. Such actinic rays may have same or different wavelength as the exposure rays used in the step of exposure. As the above external energy, heat is most preferred.

The heating conditions when curing is carried out by heating are preferably at a temperature of from 200 to 450° C. for 1 to 120 minutes, more preferably at a temperature of from 250 to 400° C. for 2 to 60 minutes.

The heating equipment is preferably a hotplate, an oven or a furnace. The heating atmosphere may, for example, be an atmosphere of an inert gas such as nitrogen or argon; air; oxygen; or reduced pressure. The heating atmosphere is particularly preferably an inert gas atmosphere or reduced pressure.

Further, the step of heating is preferably carried out as divided into a plurality of stages.

The reaction rate of the crosslinkable functional group in the cured film obtained in such a manner is preferably from 30 to 100 mol %. When the reaction rate is at least 30 mol %, the heat resistance and chemical resistance of the cured film will be good. From such a viewpoint, the reaction rate is more preferably at least 50 mol %, most preferably at least 70 mol %.

Descum

With respect to such a cured film obtained in such a manner, an unnecessary film may remain in the non-exposed portion depending on the exposure or development conditions. In such a case, it is possible to carry out a step of descum to etch the non-exposed portion, as the case requires. The etching gas in the step of descum may, for example, be an oxygen gas, an argon gas or a fluorocarbon gas. The conditions for etching are preferably conditions which make it possible to remove the unnecessary film and to minimize an influence to the film at the exposed portion. The flow rate of gas is preferably from 10 to 200 sccm (the unit is a volume (cm$^3$) flow rate per 1 min. at a prescribed temperature), and such conditions as a treatment pressure of from 1 to 50 Pa, an output of from 10 to 1,000 W and a treatment time of from 1 to 600 seconds, are preferred.

Applications of Cured Product

According to the present invention, it is possible to obtain a prepolymer having a polyaryl ether structure on its main chain, which has a crosslinkable functional group and a specific side chain represented by the above formula (I). With respect to a cured product obtained by curing the prepolymer, suitable heat resistance, high water repellency and high oil repellency are simultaneously achieved.

The cured product or cured film produced by using the prepolymer of the present invention is suitable for an application in which heat resistance, water repellency and oil repellency are required.

Particularly, the cured film produced by using the photosensitive composition of the present invention has concavoconvex forms on the surface, and is suitable for an application in which water repellency and oil repellency are required. With respect to the cured film having concavoconvex forms on the surface, in such concavoconvex forms on the surface, the film derived from the photosensitive composition of the present invention may remain in a concave portion, and at a part or entire bottom surface of the concave portion, the substrate may be exposed. When the bottom surface of the concave portion is desired to have the water repellency and oil repellency, the bottom surface of the concave portion is preferably covered by the film derived from the photosensitive composition of the present invention.

Specific examples for applications may be a releasing material for e.g. a mold or a die (particularly, it is for forming fine patterns by e.g. hot emboss or nanoimprint lithography); a surface protecting film for a MEMS (microelectronic mechanical system) device such as an ink-jet printer head or a sensor; a coating for a fixing roll for a copier; a coating for a liquid lens material; an oil seal material; a coating for a bonding material or a sealing material; a coating for an injector for a vehicle; an oil repellent and water proof ventilation filter; a sealing agent; a bank material; an additive to a resin; a water repellent and oil repellent film for home electronics and cooking utensils; a weather resistant film; a moisture proof coating; various protecting layers (a heat resistant and water repellent layer and a heat resistant and oil repellent layer); and various films (a heat resistant and water repellent film and a heat resistant and oil repellent film).

Particularly, the prepolymer having the side chain represented by the above formula (I) introduced can form a cured product or a cured film which satisfies heat resistance, water repellency, oil repellency, non-tackiness, low frictional property, friction resistance, low dielectric constant and low birefringence, and thus, it is suitable for the above applications and can be used widely for other applications as well.

The specific examples of the applications of the cured product or cured film of the prepolymer of the present invention may be a membrane material for various cells such as a fuel cell; a coating for e.g. an engine piston for a vehicle, a bearing for a fixing portion of a copier, a compressor bearing for an air conditioner, a bearing for a vehicle engine, a swash plate of a car compressor or a sliding bearing for a vehicle; an insulation coating of a heat slinger for a power semiconductor; an insulation film for an electronic device or a multilayer wiring board; an electronic component; an LCD alignment film; an optical waveguide; and a nonlinear optical material.

Article

Further, an article having the cured film of the present invention is not particularly limited. Preferred examples may be a mold, a die (particularly, for forming fine patterns by e.g. a hot emboss or nanoimprint lithography); MEMS (microelectronic mechanical system) devices such as an ink-jet printer head and a sensor; a fixing roll for a copier; a liquid lens material; an oil sealing material; a bonding material or sealing material; an injector for a vehicle; an oil repellent and water proof ventilation filter; a sealing agent; a bank material; a water repellent and oil repellent material for home electronics and cooking utensils; a weather resistant coating film; a moisture proof coating; various protecting layers (a heat resistant and water repellent layer and a heat resistant and oil repellent layer); various films (a heat resistant and water repellent film and a heat resistant and oil repellent film); a membrane material for various cells such as a fuel cell; an engine piston for a vehicle; a bearing for a fixing portion of a copier; a compressor bearing for an air conditioner; a bearing for a vehicle engine; a swash plate of a car compressor; a sliding bearing for a vehicle; a heat slinger insulation coating for a power semiconductor; an insulation film for an electronic device or a multilayer wiring board; an electronic material; an LCD alignment film; an optical waveguide; and a nonlinear optical material.

EXAMPLES

Now, the present invention will be described in further detail with reference to the following Examples, but it is by no means thereby restricted. Here, the respective measurement items were measured by the following methods.

Molecular Weight

A vacuum dried prepolymer powder was subjected to a gel permeation chromatography (GPC) method to obtain a number average molecular weight calculated as polystyrene. Tetrahydrofuran was used as the carrier solvent.

Exposure

Exposure was carried out by using UL-7000 (manufactured by Quintel) and irradiating light of an ultrahigh-pressure mercury lamp. Further, with respect to a non-exposed portion, a light proof portion was formed by using a metal foil or a mask.

Confirmation of Ether Bond

The confirmation was carried out in such a manner that a vacuum dried prepolymer powder was measured by IR, to ascertain the presence of an absorption near 1,300 cm$^{-1}$.

Confirmation of Crosslinkable Functional Group

The confirmation was carried out in such a manner that a vacuum dried prepolymer powder was dissolved in deuterated acetone, followed by measuring NMR to observe a signal in a prescribed range. When the crosslinkable functional group is a vinyl group, a signal appears at $\delta$=5.0 to 7.0 ppm, and when it is an ethynyl group, a signal appears in the vicinity of $\delta$=4.5 ppm.

Preparation Example 1

Preparation of Precursor (P2-1)

The precursor (P2-1) was produced by the production method (ii) by using the compounds (B), (C) and (Y-2).

That is, into a 50 mL two-necked flask equipped with a Dimroth condenser and a stirrer chip, 1.15 g (0.006 mol) of pentafluorophenylacetylene as the compound (Y-2), 0.65 g (0.005 mol) of 1,3,5-trihydroxybenzene as the compound (C), 2.00 g (0.006 mol) of perfluorobiphenyl as the compound (B) and 34.22 g of DMAc (N,N-dimethylacetamide) as the solvent were charged.

The mixture was heated to 60° C. on an oil bath with stirring, and 3.23 g (0.03 mol) of sodium carbonate as the HF scavenger was quickly added, followed by continuous stirring at 60° C. for 22 hours.

Then, the reaction liquid was cooled to room temperature and gradually added to 150 mL of an intensely stirred 0.5N hydrochloric acid aqueous solution, whereby a slightly brown powder product was precipitated. Such a slightly brown powder product was subjected to filtration, followed by washing twice with pure water, and then by vacuum drying at 80° C. for 12 hours to obtain 2.58 g of white powder precursor (P2-1).

Preparation Example 2

Preparation of Precursor (P2-2)

The precursor (P2-2) was produced by the production method (ii) by using the compounds (B), (C) and (Y-2).

Into a 100 mL glass four-necked flask equipped with a Dimroth condenser, a thermocouple thermometer and a mechanical stirrer, 2.2 g (0.01 mol) of pentafluorostyrene as the compound (Y-2), 3.3 g (0.01 mol) of 1,1,1-tris(4-hydroxyphenyl)ethane as the compound (C) and 49.2 g of DMAc as the solvent were charged.

The mixture was heated on an oil bath with stirring, and when the liquid temperature became 60° C., 5.1 g (0.05 mol) of sodium carbonate as the HF scavenger was quickly added. Heating was carried out at 60° C. for 24 hours with continuous stirring.

Then, a solution having 4.0 g (0.01 mol) of perfluorobiphenyl as the compound (B) dissolved in 36.0 g of DMAc, was added, followed by further heating at 60° C. for 17 hours.

Then, the reaction liquid was cooled to room temperature and gradually dropped into about 300 mL of an intensely stirred 0.5N hydrochloric acid aqueous solution to carry out reprecipitation. After filtration, it was washed twice with pure water, and then subjected to vacuum drying at 60° C. for 12 hours to obtain 7.5 g of white powder precursor (P2-2).

Preparation Example 3

Preparation of Precursor (P1-1)

The precursor (P1-1) was produced by using the compounds (B), (C) and (Y-2).

That is, a 200 mL two-necked flask equipped with a Dimroth condenser and a stirrer chip, 1.79 g (0.014 mol) of 1,3,5-trihydroxybenzene as the compound (C), 10.0 g (0.030 mol) of perfluorobiphenyl as the compound (B), and 106.14 g of DMAc as the solvent were charged.

The mixture was heated to 40° C. on an oil bath with stirring, and 8.84 g (0.064 mol) of potassium carbonate as the HF scavenger was quickly added, followed by heating at 40° C. for 24 hours with continuous stirring.

Then, the reaction liquid was cooled to room temperature and gradually added to a 300 mL of an intensely stirred 0.5N hydrochloric acid aqueous solution, whereby a white powder product was precipitated. Such a white powder product was subjected to filtration and washed twice with pure water, and then subjected to vacuum drying at 80° C. for 12 hours to obtain 9.84 g of white powder precursor (P1-1).

Example 1

Introduction of Side Chain to Precursor (P2-1)

Into a 50 mL Pyrex (registered trademark) four-necked flask equipped with a Dimroth condenser, a thermocouple thermometer and a mechanical stirrer, 3 g of the precursor (P2-1) obtained in Preparation Example 1, 0.45 g (0.0005 mol) of $CF_3(OCF_2CF_2)_nOCF_2CH_2OH$ (average molecular weight: 1,000) (Q-1) as the alcohol (Q) and 31.1 g of tetrahydrofuran (THF) as the solvent were charged.

The mixture was stirred at room temperature, and 0.06 g (0.001 mol) of sodium hydride as the HF scavenger (55% mineral oil dispersed material) was added. After the addition, the mixture was heated to 30° C. on an oil bath with stirring, followed by stirring for 45 hours.

Then, the reaction liquid was cooled to room temperature and gradually added to 120 g of an intensely stirred hydrochloric acid aqueous solution-containing methanol (6 g of hydrochloric acid and 114 g of methanol), whereby a slightly brown powder product was precipitated. Such a slightly brown powder product was subjected to filtration and washed three times with methanol, followed by washing three times with hexane and then by vacuum drying at 60° C. for 12 hours to obtain 2.4 g of white powder prepolymer A.

The NMR spectrum data of the prepolymer A obtained in this Example are shown as follows. Such NMR spectrum data are shown within a range of an apparent chemical shift (the same applies hereinafter). Hereinafter, tetramethylsilane is shown as TMS).

NMR Spectrum $^1$H-NMR (300.4 MHz, acetone-d6 solvent, standard: TMS) δ (ppm): 4.50 (CC—H), 5.08 ($CF_2$—$CH_2$—O), 6.69 to 7.24 (Ph-H)

$^{19}$F-NMR (282.7 MHz, acetone-d6 solvent, standard: $CFCl_3$) δ (ppm): −55.2 ($CF_3$), −77.9 (—$CF_2$—$CH_2O$), −88.2 to −90.3 ($CF_2$—O), −137.2 to −161.9 (Ph-F)

Example 2

Introduction of Side Chain to Precursor (P2-2)

Into the same four-necked flask as in the above Example 1, 3 g of the precursor (P2-2) obtained in Preparation Example 2, 0.45 g (0.0005 mol) of the same alcohol (Q-1) as in Example 1 and 32.2 g of the same solvent (THF) as in Example 1 were charged.

The mixture was stirred at room temperature, and 0.06 g (0.001 mol) of the same HF scavenger as in Example 1 was added thereto. After the addition, the mixture was heated to 50° C. on an oil bath with stirring, followed by stirring for 24 hours.

Then, the reaction liquid was cooled to room temperature, and the same operation as in Example 1 was carried out to obtain 2.8 g of white powder prepolymer B.

The NMR spectrum data of the prepolymer B obtained in this Example are shown as follows.

NMR Spectrum $^1$H-NMR (300.4 MHz, acetone-d6 solvent, standard: TMS) δ (ppm): 2.19 (C—$CH_3$), 5.08 ($CF_2$—$CH_2$—O), 5.77 (Ph-CH=$CH_2$), 6.08 (Ph-CH=$CH_2$), 6.73 (Ph-CH=$CH_2$), 6.90 to 7.21 (Ph-H)

$^{19}$F-NMR (282.7 MHz, acetone-d6 solvent, standard: $CFCl_3$) δ (ppm): −55.2 ($CF_3$), −77.9 (—$CF_2$—$CH_2O$), −88.2 to −90.3 ($CF_2$—O), −138.3 to −161.9 (Ph-F)

Example 3

Introduction of Side Chain to Precursor (P2-2)

Into the same four-necked flask as in the above Example 1, 3 g of the precursor (P2-2) obtained in Preparation Example 2, 0.75 g (0.002 mol) of $CF_3CF_2CF_2CF_2OCF_2CF_2OCF_2CH_2OH$ (Q-2) as the alcohol (Q) and 33.8 g of the same solvent as in Example 1 were charged.

The mixture was stirred at room temperature, and 0.23 g (0.005 mol) of the same HF scavenger as in Example 1 was added thereto. After the addition, the mixture was heated to 50° C. on an oil bath with stirring, followed by stirring for 94 hours.

Then, the reaction liquid was cooled to room temperature, and the same operation as in Example 1 was carried out to obtain 3.1 g of white powder prepolymer C.

The obtained prepolymer had an ether bond, a vinyl group as the crosslinkable functional group and a fluorinated side chain.

Example 4

Introduction of Side Chain to Precursor (P2-2)

Into the same four-necked flask as in the above Example 1, 2.5 g of the precursor (P2-2) obtained in Preparation Example 2, 0.63 g (0.001 mol) of $CF_3CF_2CF_2CF_2CF_2CF_2OCF_2CF_2OCF_2CH_2OH$ (Q-3) as the alcohol (Q) and 28.1 g of the same solvent as in Example 1 were charged.

The mixture was stirred at room temperature, and 0.16 g (0.004 mol) of the same HF scavenger as in Example 1 was added thereto. After the addition, the mixture was heated to 50° C. on an oil bath with stirring, followed by stirring for 69 hours.

Then, the reaction liquid was cooled to room temperature, and the same operation as in Example 1 was carried out to obtain 2.5 g of white powder prepolymer D.

The obtained prepolymer had an ether bond, a vinyl group as the crosslinkable functional group and a fluorinated side chain.

Example 5

Introduction of Side Chain to Precursor (P2-2)

Into the same four-necked flask as in the above Example 1, 3.0 g of the precursor (P2-2) obtained in Preparation Example 2, and 0.75 g (0.002 mol) of $CF_3CF_2CF_2OCF(CF_3)CF_2OCF(CF_3)CH_2OH$ (Q-4) as the alcohol (Q) and 33.8 g of the same solvent as in Example 1 were charged.

The mixture was stirred at room temperature, and 0.20 g (0.005 mol) of the same HF scavenger as in Example 1 was added thereto. After the addition, the mixture was heated to 50° C. on an oil bath with stirring, followed by stirring for 17 hours.

Then, the reaction liquid was cooled to room temperature, and the same operation as in Example 1 was carried out to obtain 3.1 g of white powder prepolymer E.

The obtained prepolymer had an ether bond, a vinyl group as the crosslinkable functional group and a fluorinated side chain.

Example 6

Introduction of Side Chain to Precursor (P2-2)

Into the same four-necked flask as in the above Example 1, 2.0 g of the precursor (P2-2) obtained in Preparation Example 2, and 0.50 g (0.001 mol) of $FAdCH_2OH$ (Q-5) as the alcohol (Q) and 22.5 g of the same solvent as in Example 1 were charged.

The mixture was stirred at room temperature, and 0.15 g (0.003 mol) of the same HF scavenger as in Example 1 was added thereto. After the addition, the mixture was heated to 50° C. on an oil bath with stirring, followed by stirring for 45 hours.

Then, the reaction liquid was cooled to room temperature, and the same operation as in Example 1 was carried out to obtain 1.9 g of white powder prepolymer F.

The obtained prepolymer had an ether bond, a vinyl group as the crosslinkable functional group and a fluorinated side chain.

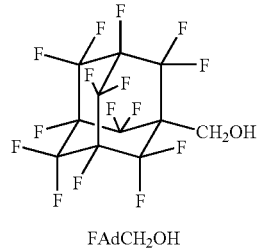

$FAdCH_2OH$

Example 7

Introduction of Side Chain to Precursor (P1-1)

Into a 50 mL Pyrex (registered trademark) four-necked flask equipped with a Dimroth condenser, a thermocouple thermometer and a mechanical stirrer, 3 g of the precursor (P1-1) obtained in Preparation Example 3, 0.75 g (0.001 mol) of the same alcohol (Q-1) as in Example 1 and 33.8 g of DMAc as the solvent were charged.

The mixture was heated to 60° C. on an oil bath with stirring, and 0.94 g (0.003 mol) of cesium carbonate as the HF scavenger was quickly added thereto, followed by heating at 60° C. for 46 hours with continuous stirring.

Then, the reaction liquid was cooled to room temperature and gradually added to 120 g of intensely stirred 0.5 mol/L hydrochloric acid, whereby a white powder product was precipitated. Such a white powder product was subjected to filtration and washed three times with water, and then subjected to vacuum drying at 60° C. for 12 hours to obtain 3.1 g of a white powder polymer.

Then, into a 50 mL Pyrex (registered trademark) four-necked flask equipped with a Dimroth condenser, a thermocouple thermometer and a mechanical stirrer, 2 g of the polymer obtained in the above reaction, 0.35 g (0.002 mol) of 4-acetoxystyrene and 21.2 g of diethylene glycol dimethyl ether as the solvent were charged.

With stirring, 0.76 g (0.006 mol) of potassium hydroxide (48% aqueous solution) was quickly added thereto, followed by stirring for 22 hours.

Then, the reaction liquid was gradually added to 100 g of intensely stirred 0.5 mol/L hydrochloric acid, whereby a white powder product was precipitated. Such a white powder product was subjected to filtration and washed three times with water, and then subjected to vacuum drying at 60° C. for 12 hours to obtain 2.0 g of a white powder prepolymer G.

The obtained prepolymer had an ether bond, a vinyl group as the crosslinkable functional group and a fluorinated side chain.

Example 8

Introduction of Side Chain to Precursor (P1-1)

Into a 50 mL Pyrex (registered trademark) four-necked flask equipped with a Dimroth condenser, a thermocouple thermometer and a mechanical stirrer, 3 g of the precursor (P1-1) obtained in Preparation Example 3, 0.45 g (0.0004 mol) of the same alcohol (Q-1) as in Example 1 and 31.1 g of DMAc as the solvent were charged.

The mixture was heated to 60° C. on an oil bath with stirring, and 0.56 g (0.002 mol) of cesium carbonate as the HF scavenger was quickly added thereto, followed by heating at 60° C. for 41 hours with continuous stirring.

Then, the reaction liquid was cooled to room temperature, and the same operation as in Example 7 was carried out to obtain 2.8 g of a white powder polymer.

Then, into a 50 mL Pyrex (registered trademark) four-necked flask equipped with a Dimroth condenser, a thermocouple thermometer and a mechanical stirrer, 2.5 g of the polymer obtained in the above reaction, 0.50 g (0.003 mol) of 4-acetoxystyrene and 27.1 g of diethylene glycol dimethyl ether as the solvent were charged.

With stirring, 1.1 g (0.009 mol) of potassium hydroxide (48% aqueous solution) was quickly added thereto, followed by stirring for 25 hours.

Then, the same operation as in Example 7 was carried out to obtain 2.5 g of a white powder prepolymer H.

The obtained prepolymer had an ether bond, a vinyl group as the crosslinkable functional group and a fluorinated side chain.

Example 9

Introduction of Side Chain to Precursor (P1-1)

Into a 50 mL Pyrex (registered trademark) four-necked flask equipped with a Dimroth condenser, a thermocouple thermometer and a mechanical stirrer, 3 g of the precursor (P1-1) obtained in Preparation Example 3, 0.45 g (0.0004 mol) of the same alcohol (Q-1) as in Example 1 and 31.1 g of DMAc as the solvent were charged.

The mixture was heated to 60° C. on an oil bath with stirring, and 0.56 g (0.002 mol) of cesium carbonate as the HF scavenger was quickly added thereto, followed by heating at 60° C. for 41 hours with continuous stirring.

Then, the reaction liquid was cooled to room temperature, and the same operation as in Example 7 was carried out to obtain 2.8 g of a white powder polymer.

Then, into a 50 mL Pyrex (registered trademark) four-necked flask equipped with a Dimroth condenser, a thermocouple thermometer and a mechanical stirrer, 2.5 g of the polymer obtained in the above reaction, 0.38 g (0.002 mol) of 4-acetoxystyrene and 25.9 g of diethylene glycol dimethyl ether as the solvent were charged.

With stirring, 0.82 g (0.007 mol) of potassium hydroxide (48% aqueous solution) was quickly added thereto, followed by stirring for 44 hours.

Then, the same operation as in Example 7 was carried out to obtain 2.4 g of a white powder prepolymer I.

The obtained prepolymer had an ether bond, a vinyl group as the crosslinkable functional group and a fluorinated side chain.

Example 10

Introduction of Side Chain to Precursor (P1-1)

Into a 50 mL Pyrex (registered trademark) four-necked flask equipped with a Dimroth condenser, a thermocouple thermometer and a mechanical stirrer, 3 g of the precursor (P1-1) obtained in Preparation Example 3, 0.45 g (0.0004 mol) of the same alcohol (Q-1) as in Example 1 and 31.1 g of DMAc as the solvent were charged.

The mixture was heated to 60° C. on an oil bath with stirring, and 0.56 g (0.002 mol) of cesium carbonate as the HF scavenger was quickly added thereto, followed by heating at 60° C. for 41 hours with continuous stirring.

Then, the reaction liquid was cooled to room temperature, and the same operation as in Example 7 was carried out to obtain 2.8 g of a white powder polymer.

Then, into a 50 mL Pyrex (registered trademark) four-necked flask equipped with a Dimroth condenser, a thermocouple thermometer and a mechanical stirrer, 2.5 g of the polymer obtained in the above reaction, 0.25 g (0.002 mol) of 4-acetoxystyrene and 24.8 g of diethylene glycol dimethyl ether as the solvent were charged.

With stirring, 0.55 g (0.005 mol) of potassium hydroxide (48% aqueous solution) was quickly added thereto, followed by stirring for 44 hours.

Then, the same operation as in Example 7 was carried out to obtain 2.4 g of a white powder prepolymer J.

The obtained prepolymer had an ether bond, a vinyl group as the crosslinkable functional group and a fluorinated side chain.

Example 11

Introduction of Side Chain to Precursor (P1-1)

Into a 50 mL Pyrex (registered trademark) four-necked flask equipped with a Dimroth condenser, a thermocouple thermometer and a mechanical stirrer, 4 g of the precursor (P1-1) obtained in Preparation Example 3, 0.20 g (0.0002 mol) of the same alcohol (Q-1) as in Example 1 and 37.8 g of DMAc as the solvent were charged.

The mixture was heated to 60° C. on an oil bath with stirring, and 0.25 g (0.001 mol) of cesium carbonate as the HF scavenger was quickly added thereto, followed by heating at 60° C. for 46 hours with continuous stirring.

Then, the reaction liquid was cooled to room temperature, and the same operation as in Example 7 was carried out to obtain 3.9 g of a white powder polymer.

Then, into a 50 mL Pyrex (registered trademark) four-necked flask equipped with a Dimroth condenser, a thermocouple thermometer and a mechanical stirrer, 2 g of the polymer obtained in the above reaction, 0.52 g (0.003 mol) of 4-acetoxystyrene and 22.7 g of diethylene glycol dimethyl ether as the solvent were charged.

With stirring, 1.1 g (0.010 mol) of potassium hydroxide (48% aqueous solution) was quickly added thereto, followed by stirring for 22 hours.

Then, the same operation as in Example 7 was carried out to obtain 2.1 g of a white powder prepolymer K.

The obtained prepolymer had an ether bond, a vinyl group as the crosslinkable functional group and a fluorinated side chain.

Example 12

Introduction of Side Chain to Precursor (P1-1)

Into a 50 mL Pyrex (registered trademark) four-necked flask equipped with a Dimroth condenser, a thermocouple thermometer and a mechanical stirrer, 4 g of the precursor (P1-1) obtained in Preparation Example 3, 0.20 g (0.0002 mol) of the same alcohol (Q-1) as in Example 1 and 37.8 g of DMAc as the solvent were charged.

The mixture was heated to 60° C. on an oil bath with stirring, and 0.25 g (0.001 mol) of cesium carbonate as the HF scavenger was quickly added thereto, followed by heating at 60° C. for 46 hours with continuous stirring.

Then, the reaction liquid was cooled to room temperature, and the same operation as in Example 7 was carried out to obtain 3.9 g of a white powder polymer.

Then, into a 50 mL Pyrex (registered trademark) four-necked flask equipped with a Dimroth condenser, a thermocouple thermometer and a mechanical stirrer, 3 g of the polymer obtained in the above reaction, 0.57 g (0.004 mol) of 4-acetoxystyrene and 32.2 g of diethylene glycol dimethyl ether as the solvent were charged.

With stirring, 1.2 g (0.011 mol) of potassium hydroxide (48% aqueous solution) was quickly added thereto, followed by stirring for 23 hours.

Then, the same operation as in Example 7 was carried out to obtain 2.7 g of a white powder prepolymer L.

The obtained prepolymer had an ether bond, a vinyl group as the crosslinkable functional group and a fluorinated side chain.

Example 13

Introduction of Side Chain to Precursor (P1-1)

Into a 50 mL Pyrex (registered trademark) four-necked flask equipped with a Dimroth condenser, a thermocouple thermometer and a mechanical stirrer, 4 g of the precursor (P1-1) obtained in Preparation Example 3, 0.20 g (0.0002 mol) of the same alcohol (Q-1) as in Example 1 and 37.8 g of DMAc as the solvent were charged.

The mixture was heated to 60° C. on an oil bath with stirring, and 0.25 g (0.001 mol) of cesium carbonate as the HF scavenger was quickly added thereto, followed by heating at 60° C. for 46 hours with continuous stirring.

Then, the reaction liquid was cooled to room temperature, and the same operation as in Example 7 was carried out to obtain 3.9 g of a white powder polymer.

Then, into a 50 mL Pyrex (registered trademark) four-necked flask equipped with a Dimroth condenser, a thermocouple thermometer and a mechanical stirrer, 3 g of the polymer obtained in the above reaction, 0.38 g (0.002 mol) of 4-acetoxystyrene and 30.4 g of diethylene glycol dimethyl ether as the solvent were charged.

With stirring, 0.82 g (0.007 mol) of potassium hydroxide (48% aqueous solution) was quickly added thereto, followed by stirring for 24 hours.

Then, the same operation as in Example 7 was carried out to obtain 2.8 g of a white powder prepolymer M.

The obtained prepolymer had an ether bond, a vinyl group as the crosslinkable functional group and a fluorinated side chain.

Contact Angle

By using the prepolymers P2-1 and P2-2 obtained in Preparation Examples 1 and 2 respectively and vacuum dried products (resin powders) of the prepolymers A to F obtained in Examples 1 to 6 respectively, cured films were formed, and the contact angles of the cured films were measured by the following method. The results of measurements are shown in Table 1.

The vacuum dried product (resin powder) obtained in each of Preparation Examples 1 and 2 and Examples 1 to 6 was dissolved in cyclohexanone to obtain a 15 wt % solution, and such a solution was filtrated by a PTFE (tetrafluoride ethylene resin) filter having a pore diameter of 0.5 μm. The obtained filtrate was applied on a silicon wafer by a spin coating method to form a wet film having a thickness of about 1 μm. The spinning condition was 2,000 rpm for 30 seconds.

Subsequently, prebaking was carried out by a hotplate at 100° C. (90 seconds) and at 200° C. (90 seconds) and then final baking was carried out by a vertical furnace at 250° C. (1 hour) in a nitrogen atmosphere to obtain a cured film. About 1 μL of water was dropped on the cured film thus obtained to measure the contact angle (evaluation of water repellency). Further, normal decane was dropped on such an obtained cured film to measure the contact angle (evaluation of oil repellency). The measurement of the contact angle was carried out by a sessile drop method under a condition of 25° C. by using CA-A (product name) manufactured by Kyowa Interface Science Co., LTD.

Evaluation of Heat Resistance

By using the vacuum dried product (resin powder) obtained in each of Examples 1 and 2 as a sample, a thermogravimetric analysis was carried out by means of MTC1000S (product name) manufactured by MAC Science Co., Ltd. The condition of the analysis was to raise the temperature from room temperature to 600° C. at a rate of 10° C. per min. The results are shown in Table 1.

TABLE 1

| | Oil repellency | Water repellency | Heat resistance | | |
| --- | --- | --- | --- | --- | --- |
| | Contact angle of normal decane | Contact angle of water | Temperature for 1% weight loss | Temperature for 3% weight loss | Temperature for 5% weight loss |
| Precursor P2-1 | At most 10° | 87° | N/A | N/A | N/A |
| Precursor P2-2 | At most 10° | 87° | N/A | N/A | N/A |
| Prepolymer A | 46° | 108° | 349° C. | 404° C. | 426° C. |
| Prepolymer B | 51° | 113° | 418° C. | 447° C. | 457° C. |

TABLE 1-continued

|  | Oil repellency | Water repellency | Heat resistance | | |
|---|---|---|---|---|---|
|  | Contact angle of normal decane | Contact angle of water | Temperature for 1% weight loss | Temperature for 3% weight loss | Temperature for 5% weight loss |
| Prepolymer C | 36° | N/A | N/A | N/A | N/A |
| Prepolymer D | 40° | N/A | N/A | N/A | N/A |
| Prepolymer E | 46° | 108° | N/A | N/A | N/A |
| Prepolymer F | 21° | 101° | N/A | N/A | N/A |

As shown by the results in Table 1, the prepolymers A and B have good heat resistance, and by comparing the polymer A with the precursor P2-1 and the prepolymers B to F with P2-2, respectively, the oil repellency and water repellency of the prepolymers A to F are extremely improved.

Evaluation of Alkali Resistance

A cured film was formed by using the vacuum dried product (resin powder) of each of the prepolymers G to M obtained in Examples 7 to 13. Then, the obtained cured film was soaked in an alkali aqueous solution, and the contact angle of the cured film before and after the soak was measured by the following method. The results of measurements are shown in Table 2.

The vacuum dried product (resin powder) obtained in each of Examples 7 to 13 was dissolved in cyclohexanone to obtain a 15 wt % solution, and the solution was filtrated by a PTFE (tetrafluoride ethylene resin) filter having a pore diameter of 0.5 μm. The obtained filtrate was applied on a glass by a spin coating method to form a wet film having a thickness of about 1 μm. The spinning condition was 2,000 rpm for 30 seconds.

Subsequently, prebaking was carried out by a hotplate at 100° C. (90 seconds) and then final baking was carried out by a vertical furnace at 200° C. (1 hour) in an nitrogen atmosphere to obtain a cured film. About 1 μL of water was dropped on the cured film thus obtained to measure the contact angle (evaluation of water repellency). Further, normal decane and xylene were dropped on such an obtained cured film to measure the contact angle (evaluation of oil repellency). The measurement of the contact angle was carried out by a sessile drop method under a condition of 25° C. by using DM700 (product name) manufactured by Kyowa Interface Science Co., LTD.

Further, the cured film obtained in the same manner as the above was impregnated in a 0.1 mol/L sodium hydroxide aqueous solution, followed by heating at 60° C. for 3 days. Then, it was cooled and washed with pure water, and then dried at room temperature, whereupon the contact angle was measured in the same manner as the above. The results are shown in Table 2.

TABLE 2

|  | After film formed | | | After alkali test | | |
|---|---|---|---|---|---|---|
|  | Contact angle of normal decane | Contact angle of xylene | Contact angle of water | Contact angle of normal decane | Contact angle of xylene | Contact angle of water |
| Prepolymer G | 55° | 62° | 112° | 39° | 44° | 96° |
| Prepolymer H | 52° | 58° | 108° | 37° | 41° | 96° |
| Prepolymer I | 54° | 57° | 111° | 42° | 44° | 99° |
| Prepolymer J | 55° | 52° | 112° | 47° | 45° | 102° |
| Prepolymer K | 52° | 57° | 110° | 39° | 44° | 97° |
| Prepolymer L | 48° | 51° | 108° | 32° | 34° | 94° |
| Prepolymer M | 51° | 47° | 108° | 36° | 38° | 95° |

As shown by the results in Table 2, the prepolymers G to M have good oil repellency and water repellency before and after the alkali test and thus were found to have alkali resistance.

Example 14

The prepolymer B obtained in Example 2 was dissolved in propylene glycol monomethyl ether acetate (hereinafter referred to as PGMEA) to prepare a solution having a prepolymer concentration of 25 mass % (which is referred to as a prepolymer solution B1). Into a sample bottle, 10 g of the prepolymer solution B1 was introduced, and 0.05 g of IRGA-CURE 369 (manufactured by Ciba Specialty Chemicals K.K.) as a photosensitizer was added and dissolved to obtain a photosensitive composition.

Such a photosensitive composition was spin-coated on a silicon wafer at a rate of 1,000 rpm, for 30 seconds and then prebaked on a hotplate at 100° C. for 90 seconds to form a coating film.

To such a coating film, exposure was carried out with an irradiation energy of 1,530 mJ/cm$^2$. After the exposure, the coating film was subjected to post exposure baking at 140° C. for 1 minute, and then a puddle development was carried out for 40 seconds by using PGMEA. Further, rinsing was carried out for 30 seconds by using PGMEA.

Then, the coating film was spin-dried at 2,000 rpm for 30 seconds and then subjected to post-development baking on a hotplate. The heating condition was divided in two stages i.e. 100° C. for 90 seconds followed by 200° C. for 90 seconds.

As a result, it was possible to obtain a film having concavoconvex forms formed such that the exposed portion corresponds to a convex portion, and the non-exposed portion corresponds to a concave portion. When the film thickness of such a film was measured, the film thickness of the exposed portion was 0.82 μm, and the film thickness of the non-exposed portion was less than 0.10 μm. Further, the reference film thickness after the exposure and before the developing step was 2.0 μm.

Examples 15 to 18

A film having concavoconvex forms formed was obtained in the same manner as in Example 14 except that in Example 14, the irradiation energy or the post-exposure baking condition was changed as shown in Table 3. The results of the measurements of the film thickness of an exposed portion and the film thickness of a non-exposed portion of the obtained film are shown in Table 3.

TABLE 3

| | Exposure energy (mJ/cm²) | Post-exposure baking condition | Film thickness of exposed portion (μm) | Film thickness of non-exposed portion (μm) |
|---|---|---|---|---|
| Ex. 14 | 1,530 | 140° C. for 1 min. | 0.82 | Less than 0.10 |
| Ex. 15 | 510 | 140° C. for 1 min. | 0.12 | Less than 0.10 |
| Ex. 16 | 1,020 | 140° C. for 1 min. | 0.4 to 0.5 | Less than 0.10 |
| Ex. 17 | 1,530 | 140° C. for 2 min. | 0.84 | Less than 0.10 |
| Ex. 18 | 1,530 | N/A | 0.81 | Less than 0.10 |

As shown by the results in Table 3, concavoconvex forms were formed in Example 14 to 18. Further, by comparing Examples 14, 17 and 18, it is evident that each exposure energy is the same, but the longer the heating time during post-exposure baking, the thicker the film thickness of the exposed portion.

In Example 15, since the exposure energy was small, the difference in film thickness between the exposed portion and the non-exposed portion became small. In Example 16, the film thickness of the exposed portion became non-uniform. It is considered that the exposure energy was insufficient.

From these results, it is evident that by controlling the exposure energy and the post-exposed baking condition, it is possible to adjust the solubility of the exposed portion in a developer.

Example 19

The film having concavoconvex forms formed which was obtained in Example 14 was further heated and additionally cured in a vertical furnace at 300° C. for 30 minutes in a nitrogen atmosphere to obtain a finally cured film. With respect to the obtained cured film, the respective contact angles of the exposed portion and non-exposed portion were measured. The results are shown in Table 4.

TABLE 4

| | Oil repellency (contact angle of normal decane) | Water repellency (contact angle of water) |
|---|---|---|
| Exposed portion | 43.8° | 104.6° |
| Non-exposed portion | 24.0° | 83.6° |

From the results in Table 4, it has been found that the exposed portion made of the film formed by using the photosensitive composition of the present invention is excellent in water repellency and oil repellency as compared with the non-exposed portion having little film remained.

Further, with respect to the exposed portion of the above obtained film, the alkali resistance test was carried out in the same manner as in the evaluation shown in Table 2. The results are shown in Table 5.

TABLE 5

| After film formed | | After alkali test | |
|---|---|---|---|
| Contact angle of normal decane | Contact angle of water | Contact angle of normal decane | Contact angle of water |
| 44° | 105° | 32° | 93° |

From the results in Table 5, it has been found that the exposed portion made of the film formed by using the photosensitive composition of the present invention is excellent in oil repellency and water repellency even after the alkali test, and it has the alkali resistance.

Example 20

By using one obtained by pulverizing the cured film obtained in Example 19 as a sample, the thermogravimetric analysis was carried out by means of MTC1000S (product name) manufactured by MAC Science Co., Ltd. The analysis condition was such that the temperature was raised from room temperature to 600° C. at a rate of 10° C./min. The results are shown as follows.

Temperature for 1% weight loss: 418° C.
Temperature for 3% weight loss: 447° C.
Temperature for 5% weight loss: 457° C.

From such results, it is evident that the cured film obtained in Example 19 has good heat resistance.

The entire disclosures of Japanese Patent Application No. 2006-154515 filed on Jun. 2, 2006 and Japanese Patent Application No. 2006-315359 filed on Nov. 22, 2006 including specifications, claims and summaries are incorporated herein by reference in their entireties.

What is claimed is:

1. A crosslinkable prepolymer comprising a polyaryl ether structure on a main chain thereof,
wherein the crosslinkable prepolymer further comprises a crosslinkable functional group and a side chain represented by formula (I):

$R^f$—$CH_2$—O— (I), where $R^f$ is a $C_{3-50}$ fluorinated alkyl group that may comprise an oxygen atom forming an ether bond,
the main chain has a halogen-substituted aromatic ring having some or all of hydrogen atoms bonded to an aromatic ring substituted by halogen atoms, the side chain represented by the formula (I) is bonded to the halogen-substituted aromatic ring,
the crosslinkable prepolymer is obtained by reacting a precursor (P21) with an alcohol (Q) in a presence of a hydrogen fluoride scavenger,
the precursor (P21) is obtained by performing a condensation reaction in a presence of a hydrogen fluoride scavenger, the condensation reaction comprises a reaction of at least one of a compound (Y-1) and a compound (Y-2), a fluorinated aromatic compound (B), and a compound (C), the compound (Y-1) has a crosslinkable functional group and a phenolic hydroxyl group, the compound (Y-2) has a crosslinkable functional group and an aromatic ring substituted by fluorine atoms reactive with a phenolic hydroxyl group, the fluorinated aromatic compound (B) is represented by formula (1):

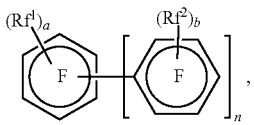 (1)

where n is an integer of from 0 to 2, each of a and b which are independent of each other is an integer of from 0 to 3, each of $Rf^1$ and $Rf^2$ which are independent of each other is a fluorinated alkyl group having at most 8 carbon atoms, provided that when multiple $Rf^1$ and $Rf^2$ are present, they may be the same or different, and F in the aromatic ring represents that hydrogen atoms bonded to the aromatic ring are all substituted by fluorine atoms, the compound (C) has at least 3 phenolic hydroxyl groups, the alcohol (Q) is represented by formula (II):

 (II)

where $R^f$ is a $C_{3-50}$ fluorinated alkyl group which may comprise an oxygen atom forming an ether bond, and the crosslinkable functional group is included in an amount of from 0.1 to 4 mmol per gram of the crosslinkable prepolymer.

2. A crosslinkable prepolymer comprising a polyaryl ether structure on a main chain thereof, wherein the crosslinkable prepolymer further comprises a crosslinkable functional group and a side chain represented by formula (I):

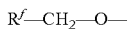 (I), where $R^f$ is a $C_{3-50}$ fluorinated alkyl group that may comprise an oxygen atom forming an ether bond, the main chain has a halogen-substituted aromatic ring having some or all of hydrogen atoms bonded to an aromatic ring substituted by halogen atoms, the side chain represented by the formula (I) is bonded to the halogen-substituted aromatic ring, the crosslinkable prepolymer is obtained by reacting a precursor (P11) with an alcohol (Q) in a presence of a hydrogen fluoride scavenger and further performing a condensation reaction with at least one of a compound (Y-1) and a compound (Y-2) in a presence of a hydrogen fluoride scavenger, the precursor (P11) is obtained by performing a condensation reaction in a presence of a hydrogen fluoride scavenger, the condensation reaction comprises a reaction of a fluorinated aromatic compound (B) and a compound (C), the fluorinated aromatic compound (B) is represented by formula (1):

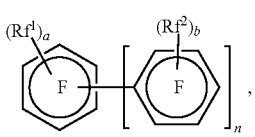 (1)

where n is an integer of from 0 to 2, each of a and b which are independent of each other is an integer of from 0 to 3, each of $Rf^1$ and $Rf^2$ which are independent of each other is a fluorinated alkyl group having at most 8 carbon atoms, provided that when multiple $Rf^1$ and $Rf^2$ are present, they may be the same or different, and F in the aromatic ring represents that hydrogen atoms bonded to the aromatic ring are all substituted by fluorine atoms, the compound (C) has at least 3 phenolic hydroxyl groups, the alcohol (Q) is represented by formula (II):

 (II)

where $R^f$ is a $C_{3-50}$ fluorinated alkyl group which may contain an oxygen atom forming an ether bond, the compound (Y-1) has a crosslinkable functional group and a phenolic hydroxyl group, the compound (Y-2) has a crosslinkable functional group and an aromatic ring substituted by fluorine atoms reactive with a phenolic hydroxyl group, and the crosslinkable functional group is included in an amount of from 0.1 to 4 mmol per gram of the crosslinkable prepolymer.

3. A cured product formed by curing the crosslinkable prepolymer as defined in claim 1.

4. A coating composition comprising:
the crosslinkable prepolymer as defined in claim 1; and
a solvent.

5. A cured film formed by a process comprising:
forming a wet film by applying the coating composition as defined in claim 4 on a substrate;
removing the solvent in the wet film; and
curing the crosslinkable prepolymer,
wherein the curing is performed either after the removing or at the same time as the removing of the solvent.

6. An article comprising the cured film as defined in claim 5.

7. A negative photosensitive composition which comprises:
the crosslinkable prepolymer as defined in claim 1;
a photosensitizer; and
a solvent.

8. The negative photosensitive composition according to claim 7, wherein the photosensitizer comprises either a photoinitiator or a photocrosslinking agent.

9. A process for producing a cured film, which comprises:
forming, on a substrate, a coating film made of the negative photosensitive composition as defined in claim 7;
exposing a portion of the coating film selectively such that a reaction of the crosslinkable functional group occurs in an exposed portion; and
developing the coating film after the exposing of the portion of the coating film.

10. A cured film which is obtained by the process as defined in claim 9.

11. An article comprising the cured film as defined in claim 10.

12. The crosslinkable prepolymer according to claim 1, wherein the crosslinkable functional group is at least one selected from the group consisting of a vinyl group, a methacryloyl(oxy) group, an acryloyl(oxy) group, a trifluorovinyl oxy group, and an ethynyl group.

13. The crosslinkable prepolymer according to claim 1, wherein the compound (Y-1) is at least one selected from the group consisting of 4-hydroxystyrene, 3-ethynylphenol, 4-phenylethynylphenol, 4-(4-fluorophenyl)ethynylphenol, 4-acetoxystyrene, 2,2'-bis(phenylethynyl)-5,5'-dihydroxybiphenyl, 2,2'-bis(phenylethynyl)-4,4'-dihydroxybiphenyl, 4,4'-dihydroxytolan, and 3,3'-dihydroxytolan.

14. The crosslinkable prepolymer according to claim 1, wherein the compound (Y-2) is at least one selected from the group consisting of pentafluorostyrene, pentafluorobenzyl acrylate, pentafluorobenzyl methacrylate, pentafluorophenyl acrylate, pentafluorophenyl methacrylate, perfluorostyrene, pentafluorophenyl trifluorovinyl ether, 3-(pentafluorophenyl)pentafluoro-1-propene, pentafluorobenzonitrile, pentafluorophenylacetylene, nonafluorobiphenylacetylene, phenylethynyl pentafluorobenzene, phenylethynyl nonafluorobiphenyl, and decafluorotolan.

15. The crosslinkable prepolymer according to claim 1, wherein the compound (C) is at least one selected from the group consisting of trihydroxybenzene, trihydroxybiphenyl, trihydroxynaphthalene, 1,1,1-tris(4-hydroxyphenyl)ethane, tris(4-hydroxyphenyl)benzene, tetrahydroxybenzene, tetrahydroxybiphenyl, tetrahydroxybinaphthyl, and tetrahydroxyspiroindane.

16. The crosslinkable prepolymer according to claim 2, wherein the crosslinkable functional group is at least one selected from the group consisting of a vinyl group, a methacryloyl(oxy) group, an acryloyl(oxy) group, a trifluorovinyl oxy group, and an ethynyl group.

17. The crosslinkable prepolymer according to claim 2, wherein the compound (Y-1) is at least one selected from the group consisting of 4-hydroxystyrene, 3-ethynylphenol, 4-phenylethynylphenol, 4-(4-fluorophenyl)ethynylphenol, 4-acetoxystyrene, 2,2'-bis(phenylethynyl)-5,5'-dihydroxybiphenyl, 2,2'-bis(phenylethynyl)-4,4'-dihydroxybiphenyl, 4,4'-dihydroxytolan, and 3,3'-dihydroxytolan.

18. The crosslinkable prepolymer according to claim 2, wherein the compound (Y-2) is at least one selected from the group consisting of pentafluorostyrene, pentafluorobenzyl acrylate, pentafluorobenzyl methacrylate, pentafluorophenyl acrylate, pentafluorophenyl methacrylate, perfluorostyrene, pentafluorophenyl trifluorovinyl ether, 3-(pentafluorophenyl)pentafluoro-1-propene, pentafluorobenzonitrile, pentafluorophenylacetylene, nonafluorobiphenylacetylene, phenylethynyl pentafluorobenzene, phenylethynyl nonafluorobiphenyl, and decafluorotolan.

19. The crosslinkable prepolymer according to claim 2, wherein the compound (C) is at least one selected from the group consisting of trihydroxybenzene, trihydroxybiphenyl, trihydroxynaphthalene, 1,1,1-tris(4-hydroxyphenyl)ethane, tris(4-hydroxyphenyl)benzene, tetrahydroxybenzene, tetrahydroxybiphenyl, tetrahydroxybinaphthyl, and tetrahydroxyspiroindane.

* * * * *